(12) United States Patent
Kyozuka

(10) Patent No.: US 12,082,346 B2
(45) Date of Patent: Sep. 3, 2024

(54) WIRING BOARD

(71) Applicant: SHINKO ELECTRIC INDUSTRIES CO., LTD., Nagano (JP)

(72) Inventor: Masahiro Kyozuka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 18/175,898

(22) Filed: Feb. 28, 2023

(65) Prior Publication Data

US 2023/0300987 A1    Sep. 21, 2023

(30) Foreign Application Priority Data

Mar. 17, 2022   (JP) .................. 2022-043179

(51) Int. Cl.
*H05K 1/02* (2006.01)
*H05K 1/05* (2006.01)
*H05K 3/00* (2006.01)

(52) U.S. Cl.
CPC ......... *H05K 3/0011* (2013.01); *H05K 1/0271* (2013.01); *H05K 1/05* (2013.01); *H05K 2201/093* (2013.01); *H05K 2201/09372* (2013.01); *H05K 2201/10204* (2013.01)

(58) Field of Classification Search
CPC ....... H05K 1/0271; H05K 1/05; H05K 3/0011
See application file for complete search history.

(56) References Cited

U.S. PATENT DOCUMENTS

| 2010/0295174 A1 | 11/2010 | Ozawa et al. |
| 2012/0096711 A1* | 4/2012 | Nakamura ........ H01L 23/49838 29/846 |
| 2022/0093493 A1* | 3/2022 | Hondo .................. H01L 23/562 |

FOREIGN PATENT DOCUMENTS

JP    2010-272681    12/2010

* cited by examiner

Primary Examiner — Jeremy C Norris
(74) Attorney, Agent, or Firm — IPUSA, PLLC

(57) ABSTRACT

A wiring board includes a first insulating layer, a pad formed on one surface of the first insulating layer, a second insulating layer, formed on the one surface of the first insulating layer, and including an opening exposing the pad, and a reinforcing metal layer formed in contact with the first insulating layer, and provided around the pad so as to be separated from the pad in a plan view. The pad is disposed inside the opening without making contact with the second insulating layer. An end, on a side of the first insulating layer, in a portion of an inner side surface of the opening of the second insulating layer makes contact with the reinforcing metal layer, and an end in another portion of the inner side surface of the opening of the second insulating layer makes contact with the one surface of the first insulating layer.

14 Claims, 15 Drawing Sheets

WIRING BOARD

CROSS-REFERENCE TO RELATED APPLICATIONS

This application is based upon and claims priority to Japanese Patent Application No. 2022-043179, filed on Mar. 17, 2022, the entire contents of which are incorporated herein by reference.

FIELD

Certain aspects of the embodiments discussed herein are related to wiring boards, and methods for manufacturing wiring boards.

BACKGROUND

A wiring board includes a pad that is exposed inside an opening provided in an insulating layer disposed at an outermost layer, for example. This pad serves as an external connection terminal for making an electrical connection with a semiconductor chip, another board or the like. Structures in which the pad is formed in the wiring board include a non-solder mask defined (NSMD) structure in which the opening is larger than the pad, and a solder mask defined (SMD) structure in which the opening is smaller than the pad.

However, when a high-temperature process, such as a reflow process or the like, is performed on the conventional wiring board having the NSMD structure, a stress is generated at an interface between the insulating layer having the opening that exposes the pad, and another insulating layer disposed thereunder, due to a difference between coefficients of thermal expansion of the two insulating layers, thereby causing a crack in at least one of the two insulating layers. In addition, a crack may be formed in at least one of the two insulating layers at the interface thereof, when a spray cleaning, an ultrasonic cleaning, or the like is performed on the wiring board. When the crack occurs at the interface, an insulation reliability of the wiring board deteriorates.

An example of the wiring board is proposed in Japanese Laid-Open Patent Publication No. 2010-272681, for example.

SUMMARY

Accordingly, one object of the present disclosure is to ensure the insulation reliability of the wiring board having the NSMD structure.

According to one aspect of the embodiments, a wiring board includes a first insulating layer; a pad formed on one surface of the first insulating layer; a second insulating layer, formed on the one surface of the first insulating layer, and including an opening exposing the pad; and a reinforcing metal layer formed in contact with the first insulating layer, and provided around the pad so as to be separated from the pad in a plan view, wherein the pad is disposed inside the opening without making contact with the second insulating layer, an end, on a side of the first insulating layer, in a portion of an inner side surface of the opening of the second insulating layer makes contact with the reinforcing metal layer, and an end, on the side of the first insulating layer, in another portion of the inner side surface of the opening of the second insulating layer makes contact with the one surface of the first insulating layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
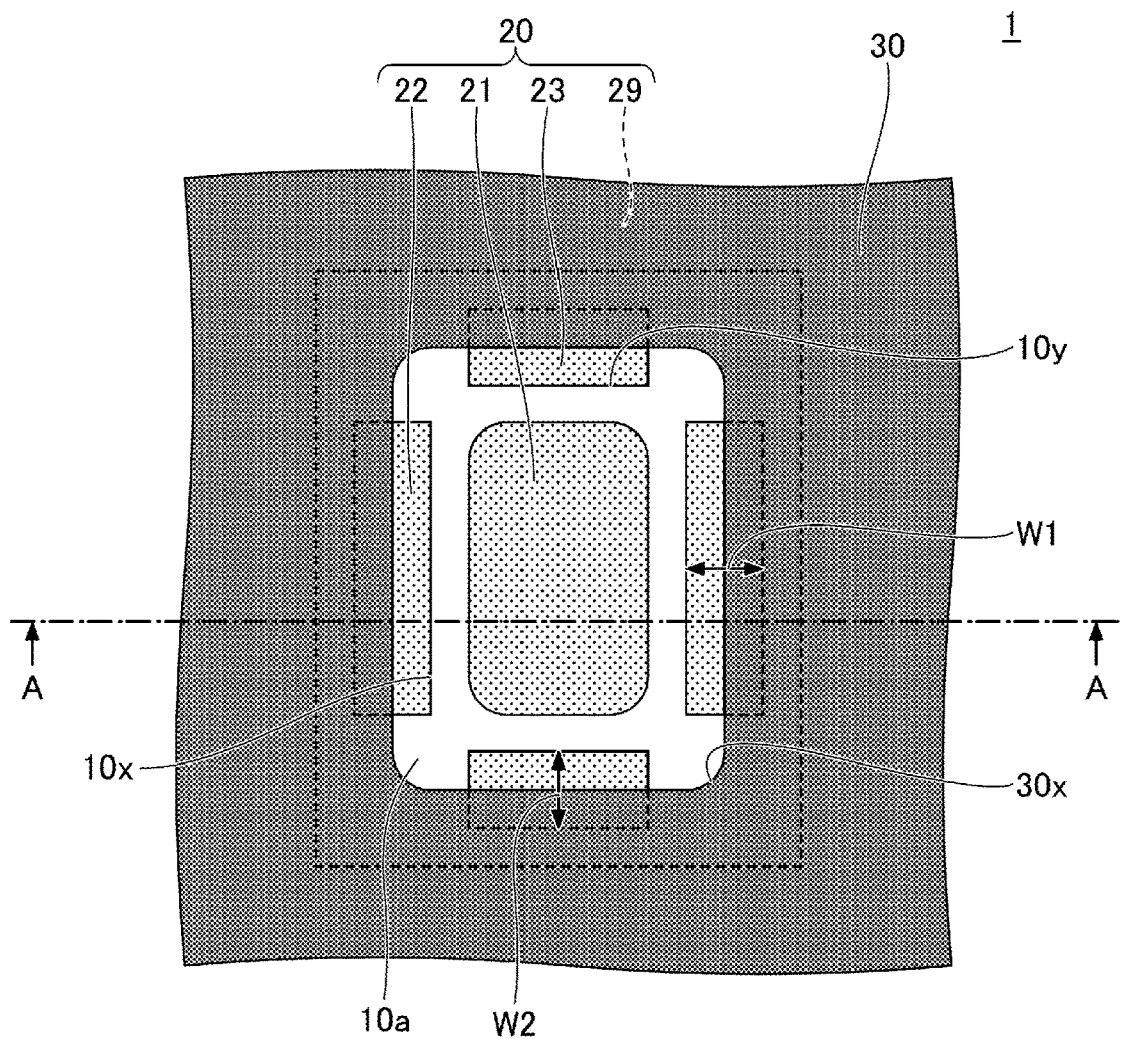
FIG. 1A and FIG. 1B are diagrams illustrating an example of a wiring board according to a first embodiment.

Preferred embodiments of the present disclosure will be described with reference to the accompanying drawings. In the drawings, those constituent elements having substantially the same functional configuration are designated by the same reference numerals, and a repeated description of the same constituent elements may be omitted.

Hereinafter, embodiments of the present invention will be described with reference to the drawings. In the drawings, those parts that are the same are designated by the same reference numerals, and repeated description of the same parts may be omitted.

First Embodiment

[Structure of Wiring Board]

Figure 1B:
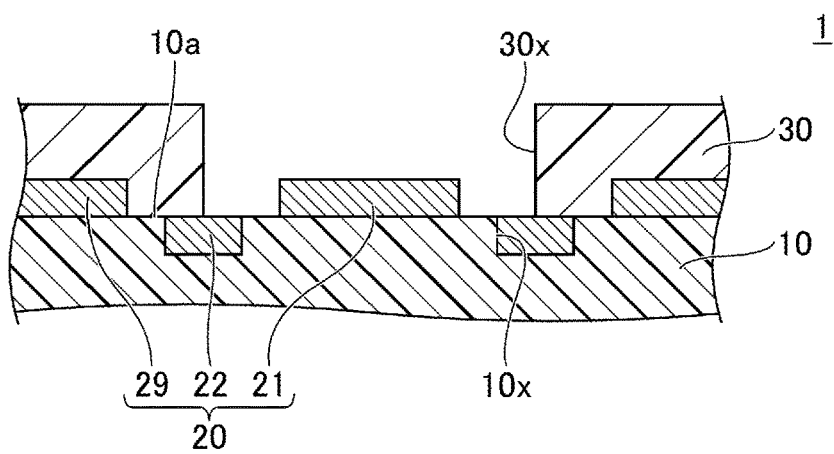

FIG. 1A and FIG. 1B are diagrams illustrating an example of a wiring board according to a first embodiment. FIG. 1A is a partial plan view of the wiring board and FIG. 1B is a partial cross sectional view along a line A-A in FIG. 1A.

As illustrated in FIG. 1A and FIG. 1B, a wiring board 1 according to the first embodiment includes an insulating layer 10, an interconnect layer 20, and a solder resist layer 30.

In the present embodiment, for sake of convenience, the side of the wiring board 1 provided with the solder resist layer 30 may be referred to as an upper side or one side, and the side of the wiring board 1 provided with the insulating layer 10 may be referred to as a lower side or the other side. In addition, a surface of each portion on the side of the wiring board 1 provided with the solder resist layer 30 may be referred to as an upper surface or one surface, and a surface of each portion on the side of the wiring board 1 provided with the insulating layer 10 may be referred to as a lower surface or the other surface. However, the wiring board 1 can be used in an upside-down state or can be disposed at an arbitrary angle. Moreover, a plan view refers to a view of an object, viewed from above, in a normal direction with respect to an upper surface 10a of the insulating layer 10. A planar shape refers to a shape of an object in the plan view, viewed from above, in the normal direction with respect to the upper surface 10a of the insulating layer 10.

The insulating layer 10 can be formed using a build-up method, as an interlayer insulator of a multilayer interconnection, for example. Accordingly, another interconnect layer or another insulating layer may be laminated underneath the insulating layer 10, as an underlying layer of the insulating layer 10. In this case, via holes may be provided in the insulating layer 10 and the other insulating layer, as appropriate, so as to electrically connect interconnect layers through the via holes.

A material used for the insulating layer 10 may be a non-photosensitive (thermosetting) insulating resin or the like including an epoxy-based resin or a polyimide-based resin as a main component thereof, for example. Further, the insulating layer 10 may include a filler, such as silica ($SiO_2$) or the like. A thickness of the insulating layer 10 may be in a range of approximately 10 μm to approximately 50 μm, for example. A coefficient of thermal expansion of the insulating layer 10 is in a range of approximately 15 ppm/° C. to approximately 20 ppm/° C., for example.

The interconnect layer 20 is formed in contact with the insulating layer 10. The interconnect layer 20 includes at least a pad 21, two reinforcing metal layers 22, two reinforcing metal layers 23, and a power supply pattern 29. The interconnect layer 20 may include an interconnect pattern or the like, in addition to the pad 21, the reinforcing metal layers 22, the reinforcing metal layers 23, and the power supply pattern 29.

The pad 21 is formed on the upper surface 10a of the insulating layer 10, and is used to electrically connect the wiring board 1 to a semiconductor chip, another wiring board or the like. A lower surface of the pad 21 makes contact with the upper surface 10a of the insulating layer 10, and upper and side surfaces of the pad 21 are exposed from the insulating layer 10. That is, the pad 21 protrudes upward from the upper surface 10a of the insulating layer 10.

A planar shape of the pad 21 is a rectangular shape with rounded corners, for example. However, the planar shape of the pad 21 is not limited to such a rectangular shape with rounded corners, and may be a circular shape, an oval shape, a rectangular shape, or the like. The rectangular shape with rounded corners refers to a rectangular shape having four rounded corners. A thickness of the pad 21 may be in a range of approximately 8 μm to approximately 25 μm, for example. A material used for the pad 21 may be copper (Cu) or the like, for example.

The power supply pattern 29 is disposed at a position separated from the pad 21 in the plan view. The power supply pattern 29 is formed on the upper surface 10a of the insulating layer 10, and a constant potential, such as a power supply potential or a ground potential, is applied to the power supply pattern 29. A lower surface of the power supply pattern 29 makes contact with the upper surface 10a of the insulating layer 10, and upper and side surfaces of the power supply pattern 29 are exposed from the insulating layer 10. That is, the power supply pattern 29 protrudes upward from the upper surface 10a of the insulating layer 10.

The reinforcing metal layers 22 and 23 have a rectangular planar shape, for example. The reinforcing metal layers 22 and 23 are disposed at positions separated from the pad 21 and the power supply pattern 29 in the plan view. In the plan view, the two reinforcing metal layers 22 are disposed adjacent to (or on the sides of) two longest sides (or two long sides) among four sides of a rectangle approximating the planar shape of the pad 21, so as to extend along the two longest sides, respectively. In the plan view, the two reinforcing metal layers 23 are disposed adjacent to (or on the sides of) two shortest sides (or two short sides) among the four sides of the rectangle approximating the planar shape of the pad 21, so as to extend along the two shortest sides, respectively. The reinforcing metal layers 22 and 23 are arranged at positions separated from one another, and are electrically insulated from the power supply pattern 29.

In the plan view, a distance between the pad 21 and the reinforcing metal layer 22, and a distance between the pad 21 and the reinforcing metal layer 23, are approximately constant, and are greater than or equal to 10 μm, for example. Further, in the plan view, a distance between the power supply pattern 29 and the reinforcing metal layer 22, and a distance between the power supply pattern 29 and the reinforcing metal layer 23, are greater than or equal to 10 μm, for example.

The reinforcing metal layer 22 is formed inside a rectangular groove 10x that opens at the upper surface 10a of the insulating layer 10. The reinforcing metal layer 23 is formed inside a rectangular groove 10y that opens at the upper surface 10a of the insulating layer 10. Upper surfaces of the reinforcing metal layers 22 and 23 coincide with the upper surface 10a of the insulating layer 10, for example. However, the upper surfaces of the reinforcing metal layers 22 and 23 may protrude from the upper surface 10a of the insulating layer 10, or may be recessed from the upper surface 10a of the insulating layer 10, for example.

Thicknesses of the reinforcing metal layers 22 and 23 are the same as the thicknesses of the pad 21 and the power supply pattern 29. Accordingly, heights of the reinforcing metal layers 22 and 23, with reference to the upper surface 10a of the insulating layer 10, are lower than heights of the pad 21 and the power supply pattern 29. That is, the upper surfaces of the reinforcing metal layers 22 and 23 are located at positions lower than the upper surfaces of the pad 21 and the power supply pattern 29. The term "same" as used in the present specification is intended to tolerate an error to an extent caused by manufacturing variation.

A width W1 of the reinforcing metal layer 22 and a widths W2 of the reinforcing metal layer 23 may be greater than or equal to 10 μm, for example. The width W1 of the reinforcing metal layer 22 is a length in a direction perpendicular to the side of the pad 21 along which the reinforcing metal layer 22 extends, that is, in a transverse direction (or short direction) of the reinforcing metal layer 22. The width W2 of the reinforcing metal layer 23 is a length in a direction perpendicular to the side of the pad 21 along which the reinforcing metal layer 23 extends, that is, in a transverse direction (or short direction) of the reinforcing metal layer 23. The thicknesses of the reinforcing metal layers 22 and 23 may be in a range of approximately 8 μm to approximately 25 μm, for example. A material used for the reinforcing metal layers 22 and 23 may be copper (Cu) or the like, for example. The reinforcing metal layers 22 and 23 may be dummy interconnects having no electrical connections.

The solder resist layer 30 is an insulating layer provided on the upper surface 10a of the insulating layer 10. The solder resist layer 30 has an opening 30x, and the pad 21 is completely exposed inside the opening 30x. The pad 21 is disposed inside the opening 30x, without making contact with the solder resist layer 30. That is, in the wiring board 1, an NSMD structure is employed as the structure forming the pad. However, in the wiring board 1, the NSMD structure and the SMD structure may coexist.

In the solder resist layer 30, a lower end (an end portion on the side of the insulating layer 10) of a portion of an inner side surface of the opening 30x makes contact with the upper surface of the reinforcing metal layer 22 or 23. That is, a portion of the reinforcing metal layer 22 (a portion far from the pad 21) is covered with the solder resist layer 30, and another portion (a portion close to the pad 21) of the reinforcing metal layer 22 is exposed inside the opening 30x of the solder resist layer 30. Similarly, a portion of the reinforcing metal layer 23 (a portion far from the pad 21) is covered with the solder resist layer 30, and another portion (a portion close to the pad 21) of the reinforcing metal layer 23 is exposed inside the opening 30x of the solder resist layer 30. In addition, in the solder resist layer 30, a lower end (an end portion on the side of the insulating layer 10) of the other portion of the inner side surface of the opening 30x makes contact with the upper surface 10a of the insulating layer 10.

For example, in a case where the planar shape of the opening 30x approximates a rectangle, the reinforcing metal layer 22 overlaps at least a center of the longest side (long side) among the four sides included in this rectangle in the plan view, and the reinforcing metal layer 23 overlaps at least a center of the shortest side (short side) among the four sides included in this rectangle in the plan view. Further, in the case where the planar shape of the opening 30x approximates the rectangle, the reinforcing metal layers 22 and 23 may be separated from four vertices included in this rectangle in the plan view. For example, a longitudinal direction of the reinforcing metal layer 22 is parallel to the long side of the rectangle, and a longitudinal direction of the reinforcing metal layer 23 is parallel to the short side of the rectangle. In the plan view, the longitudinal direction of the reinforcing metal layer 22 and the longitudinal direction of the reinforcing metal layer 23 are perpendicular to each other.

A material used for the solder resist layer 30 may be a photosensitive epoxy-based resin, acrylic-based resin, or the like, for example. A thickness of the solder resist layer 30 may be in a range of approximately 5 μm to approximately 40 μm, for example. Because the opening 30x is formed by exposing and developing the solder resist layer 30, the solder resist layer 30 preferably does not include a filler, or includes only a small amount of the filler. A filler-content in the solder resist layer 30 is smaller than a filler-content in the insulating layer 10, for example, and a coefficient of thermal expansion of the solder resist layer 30 is higher than a coefficient of thermal expansion of the insulating layer 10, for example. The coefficient of thermal expansion of the solder resist layer 30 is in a range of approximately 25 ppm/° C. to approximately 30 ppm/° C., for example.

A surface treated layer may be provided on the upper surfaces of the pad 21 and the reinforcing metal layers 22 and 23 exposed inside the opening 30x. Examples of the surface treated layer include an Au layer, a Ni/Au layer (a metal layer having a Ni layer and a Au layer that are laminated in this order), a Ni/Pd/Au layer (a metal layer having a Ni layer, a Pd layer, and a Au layer that are laminated in this order), or the like, for example. The upper surfaces of the pad 21 and the reinforcing metal layers 22 and 23 exposed inside the opening 30x may be subjected to an antioxidation treatment, such as an organic solderability preservative (OSP) treatment or the like, for example. By performing the OSP treatment, an organic coating film made of an azole compound, an imidazole compound, or the like is formed as the surface treated layer.

[Method for Manufacturing Wiring Board]

Next, a method for manufacturing the wiring board according to the first embodiment will be described. FIG. 2A through FIG. 3C are diagrams illustrating examples of manufacturing processes of the wiring board according to the first embodiment. In the present embodiment, processes or steps of manufacturing one wiring board will be illustrated and described. However, multiple parts that become wiring boards can be formed simultaneously, and the individual wiring boards can then be singulated to form each wiring board.

Figure 2A:
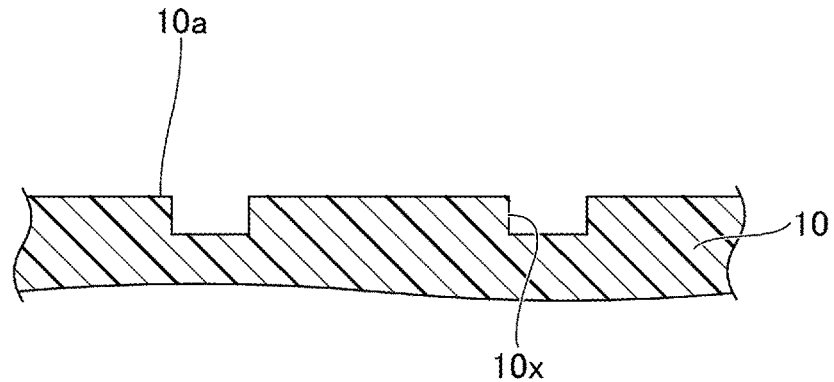
FIG. 2A, FIG. 2B, and FIG. 2C are diagrams (part 1) illustrating examples of manufacturing processes of the wiring board according to the first embodiment.

First, in a process or step illustrated in FIG. 2A, the insulating layer 10 is prepared, and the rectangular groove 10x that opens at the upper surface 10a is formed in the insulating layer 10. A rectangular groove 10y that opens at the upper surface 10a is also formed in the insulating layer 10, simultaneously as when the rectangular groove 10x is formed (refer to FIG. 1A). The grooves 10x and 10y can be formed by a laser beam machining process, for example. Widths of the grooves 10x and 10y may be greater than or equal to 10 μm, for example. Depths of the grooves 10x and 10y may be in a range of approximately 8 μm to approximately 25 μm, for example. In a case where the grooves 10x and 10y are formed by the laser beam machining process, a desmear process is preferably performed to remove resin residue of the insulating layer 10 adhered to bottom surfaces and inner side surfaces of the grooves 10x and 10y. By performing the desmear process, a roughening process can be performed on the upper surface 10a of the insulating layer 10 and the bottom surfaces and the inner side surfaces of the grooves 10x and 10y, while removing the resin residue.

Figure 2B:
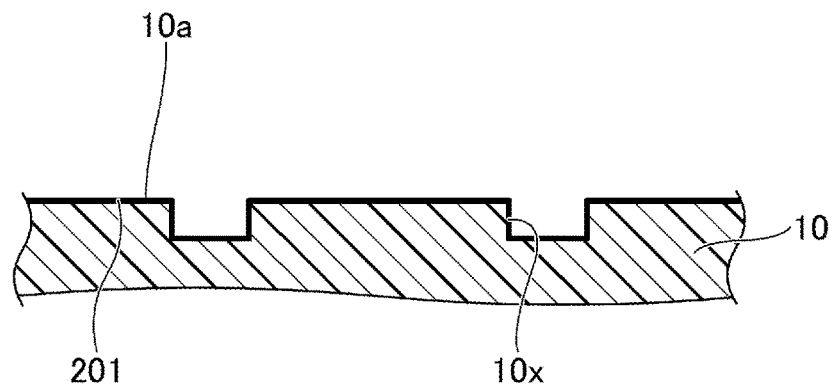

Next, in processes or steps illustrated in FIG. 2B through FIG. 3B, the interconnect layer 20, including the pad 21, the reinforcing metal layers 22 and 23, and the power supply pattern 29, is formed on the upper surface 10a of the insulating layer 10 so as to make contact with the upper surface 10a. More particularly, first, as illustrated in FIG. 2B, a seed layer 201 made of copper (Cu) or the like is formed by electroless plating or sputtering. The seed layer 201 is formed so as to continuously cover the bottom surfaces and the inner side surfaces of the grooves 10x and 10y and the upper surface 10a of the insulating layer 10.

Figure 2C:
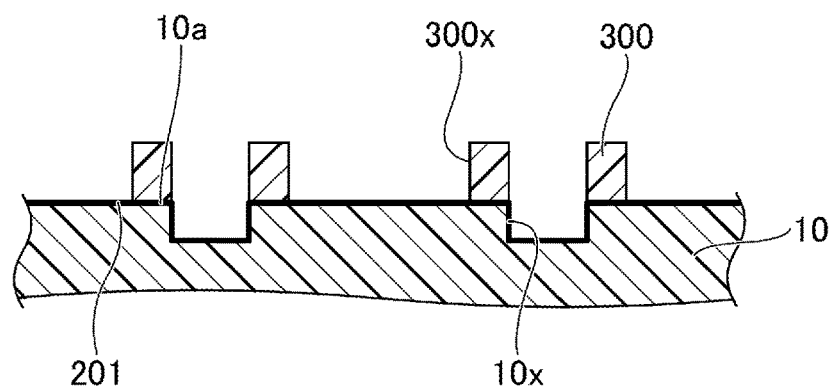

Next, as illustrated in FIG. 2C, a resist layer 300, having an opening 300x corresponding to the interconnect layer 20, is formed on the seed layer 201. The resist layer 300 can be formed by laminating a photosensitive dry film resist on the seed layer 201, for example. The opening 300x can be formed by exposing and developing the dry film resist, for example.

Figure 3A:
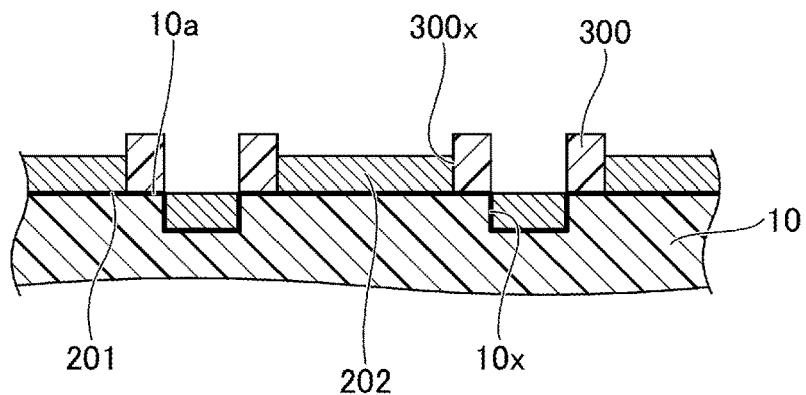
FIG. 3A, FIG. 3B, and FIG. 3C are diagrams (part 2) illustrating examples of the manufacturing processes of the wiring board according to the first embodiment.

Next, as illustrated in FIG. 3A, copper (Cu) or the like is deposited on a surface of the seed layer 201 exposed inside the opening 300x of the resist layer 300, so as to form an electrolytic plating layer 202 by an electrolytic plating process using the seed layer 201 as a power feeding layer, for example. Hence, the electrolytic plating layer 202 is formed on the seed layer 201.

Figure 3B:
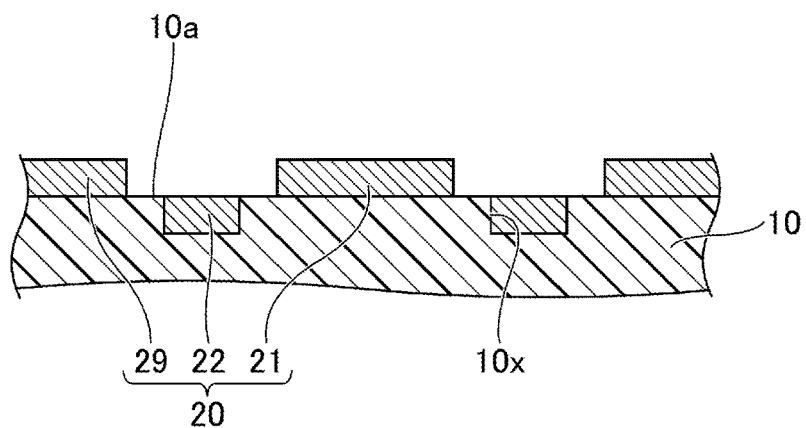

Next, as illustrated in FIG. 3B, after removing the resist layer 300, a portion of the seed layer 201, not covered with the electrolytic plating layer 202, is removed by etching using the electrolytic plating layer 202 as a mask. Hence, the interconnect layer 20 in which the electrolytic plating layer 202 is laminated on the seed layer 201 is formed. The interconnect layer 20 includes the pad 21 and the power supply pattern 29 formed on the upper surface 10a of the insulating layer 10, the reinforcing metal layer 22 formed inside the groove 10x, and the reinforcing metal layer 23 formed inside the groove 10y (refer to FIG. 1A). The reinforcing metal layers 22 and 23 are formed between the pad 21 and the power supply pattern 29 in the plan view, at positions separated from the pad 21 and the power supply pattern 29. In FIG. 3B, the seed layer 201 and the electrolytic plating layer 202 are illustrated as an integrated interconnect layer 20 without distinguishing the two layers 201 and 202 from each other, and the same applies to the following drawings, as well as FIG. 1A and FIG. 1B, or the like.

Figure 3C:
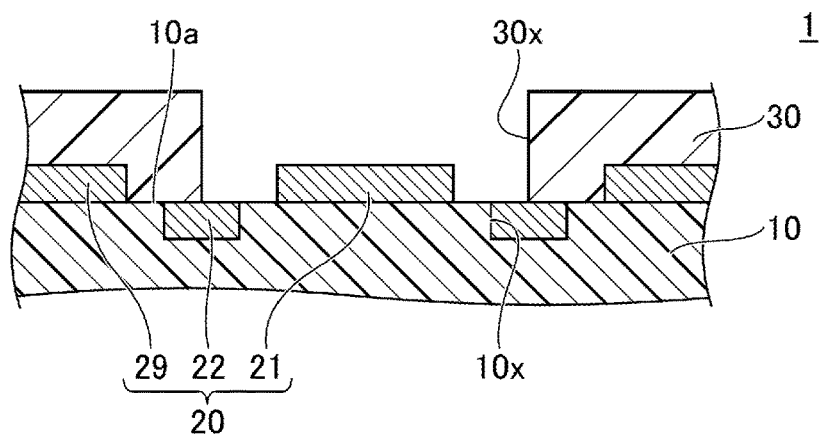

Next, in a process or step illustrated in FIG. 3C, the solder resist layer 30 is formed on the upper surface 10a of the insulating layer 10, so as to cover the interconnect layer 20 including the pad 21, the reinforcing metal layers 22 and 23, and the power supply pattern 29, the opening 30x is then formed in the solder resist layer 30. The solder resist layer 30 can be formed by coating a liquid or paste of an insulating resin on the upper surface 10a of the insulating layer 10 by screen printing, roll coating, spin coating, or the like, for example, so as to cover the interconnect layer 20. Alternatively, a film of an insulating resin may be laminated on the upper surface 10a of the insulating layer 10, so as to cover the interconnect layer 20. The insulating resin may be a photosensitive epoxy-based resin, acrylic-based resin, or the like, for example.

Next, the opening 30x is formed in the solder resist layer 30 by exposing and developing the coated or laminated insulating resin. The opening 30x is formed so that a lower end (an end portion on the side of the insulating layer 10) of a portion of the inner side surface of the opening 30x makes contact with the upper surface of the reinforcing metal layer 22 or 23, and a lower end (the end portion on the side of the insulating layer 10) of another portion of the inner side surface of the opening 30x makes contact with the upper surface 10a of the insulating layer 10 (refer also to FIG. 1A). Hence, a portion of the reinforcing metal layer 22 (a portion far from the pad 21) is covered with the solder resist layer 30, and another portion of the reinforcing metal layer 22 (a portion close to the pad 21) is exposed inside the opening 30x of the solder resist layer 30. Similarly, a portion of the reinforcing metal layer 23 (a portion far from the pad 21) is covered with the solder resist layer 30, and another portion (a portion close to the pad 21) of the reinforcing metal layer 23 is exposed inside the opening 30x of the solder resist layer 30. In addition, the pad 21 is completely exposed inside the opening 30x. That is, the pad 21 is disposed inside the opening 30x without making contact with the solder resist layer 30.

For example, in the case where the planar shape of the opening 30x approximates the rectangle, the opening 30x is formed so that the reinforcing metal layer 22 overlaps at least the center of the longest side (long side) among the four sides included in this rectangle in the plan view, and the reinforcing metal layer 23 overlaps at least the center of the shortest side (short side) among the four sides included in this rectangle in the plan view. Further, in the case where the planar shape of the opening 30x approximates the rectangle, the opening 30x may be formed so that the reinforcing metal layers 22 and 23 are separated from the four vertices included in this rectangle in the plan view.

The surface treated layer may be provided on the upper surfaces of the pad 21 and the reinforcing metal layers 22 and 23 exposed inside the opening 30x, as required. The wiring board 1 is completed by the processes or steps described above.

Figure 4A:
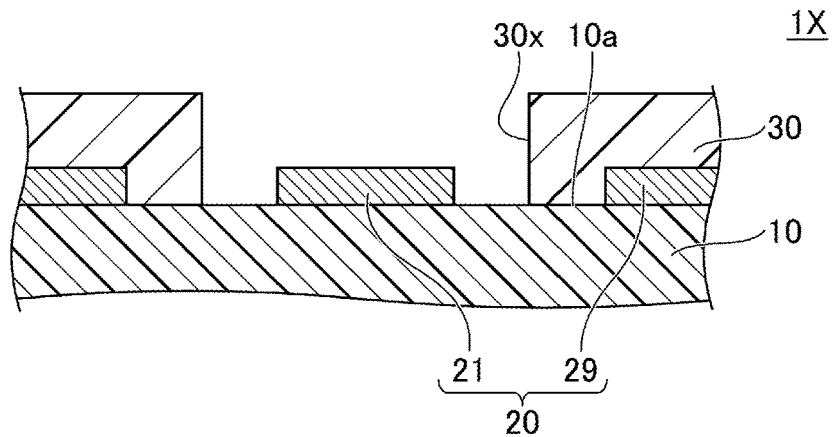
FIG. 4A, FIG. 4B, and FIG. 4C are cross sectional views illustrating an example of a wiring board according to a first comparative example.
Figure 4B:
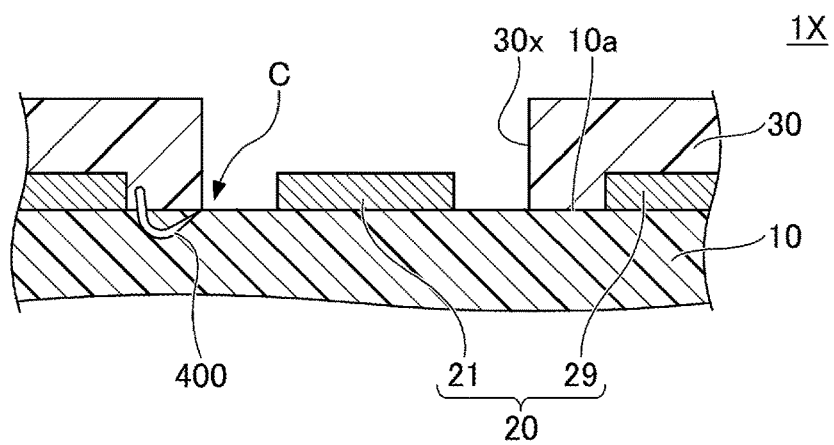
Figure 4C:
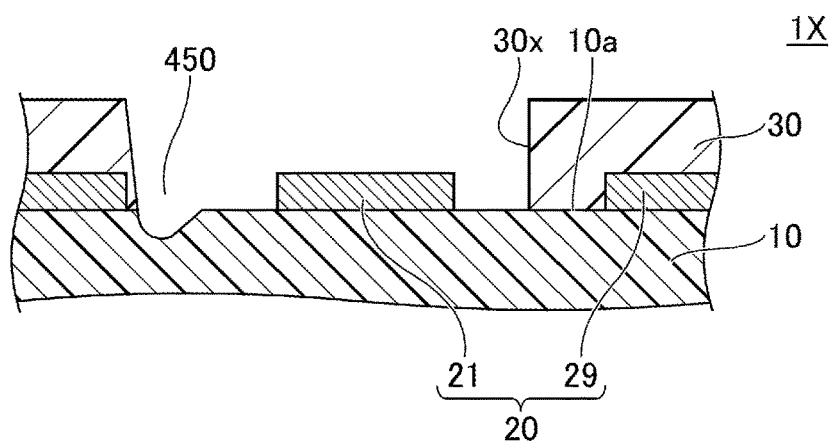

Next, effects or features obtainable by the wiring board 1 will be described, with reference to a first comparative example. FIG. 4A, FIG. 4B, and FIG. 4C are cross sectional views illustrating an example of a wiring board according to the first comparative example. A wiring board 1X illustrated in FIG. 4A differs from the wiring board 1 (refer to FIG. 1A or the like) in that the groove 10x and the 10y are not formed in the insulating layer 10, and the reinforcing metal layers 22 and 23 are not provided.

In the solder resist layer 30 of the wiring board 1X according to the first comparative example, the lower end (the end portion on the side of the insulating layer 10) of the inner side surface of the opening 30x makes contact with the upper surface 10a of the insulating layer 10. As described above, when the coefficients of thermal expansion of the insulating layer 10 and the solder resist layer 30 are compared, the coefficient of thermal expansion of the solder resist layer 30 is higher. In addition, because the insulating layer 10 has a lower flexibility than the solder resist layer 30, the insulating layer 10 is likely to crack more easily than the solder resist layer 30.

For this reason, when a high-temperature process, such as a reflow process or the like, is performed, a stress is generated at an interface between the insulating layer 10 and the solder resist layer 30, due to a difference (or a mismatch) between the coefficients of thermal expansion of the two layers 10 and 30. In a case where an adhesion between the insulating layer 10 and the solder resist layer 30 is high, a crack 400 having an origin at a starting point (a portion indicated by an arrow C) of the interface where the stress becomes the largest is generated in the insulating layer 10 that has the lower flexibility and is likely to crack more easily than the solder resist layer 30, as illustrated in FIG. 4B.

The crack 400 generated in the insulating layer 10 propagates to the solder resist layer 30, and a chipping 450 illustrated in FIG. 4C is generated in the solder resist layer 30. When the chipping 450 is generated, an insulating reliability between the adjacent pads 21, and an electrical connection reliability between the wiring board 1X and the semiconductor chip, another board or the like deteriorate.

In contrast, in the solder resist layer 30 of the wiring board 1, the lower end (the end portion on the side of the insulating layer 10) of the portion of the inner side surface of the opening 30x makes contact with the upper surface of the reinforcing metal layer 22 or 23. That is, in the wiring board 1, because the interface between the insulating layer 10 and the solder resist layer 30 is only present at a portion of the opening 30x, the portion that may form the origin of the crack corresponding to the arrow C in FIG. 4B is small. In the wiring board 1, because the reinforcing metal layer 22 or 23 is made of a metal having a high rigidity and makes contact with the solder resist layer 30 at the portion of the opening 30x, the reinforcing metal layer 22 or 23 will not crack even when the high-temperature process, such as the reflow process or the like, is performed. For this reason, it is possible to reduce the generation of cracks and chipping in the insulating layer 10 and the solder resist layer 30. As a result, it is possible to ensure the insulation reliability between the adjacent pads 21, and the electrical connection reliability between the wiring board 1 and the semiconductor chip, another board or the like.

In addition, when the planar shape of the opening 30x approximates the rectangle, the crack corresponding to the arrow C in FIG. 4B is likely generated in a vicinity of the centers of the four sides included in the rectangle in the plan view, and more likely generated particularly in a vicinity of the centers of the long sides. It may be regarded that the crack is more likely generated in the vicinity of the centers of the long sides of the rectangle, because a displacement caused by a thermal stress increases as a distance from the four vertices included in the rectangle increases. In contrast, in the present embodiment, the reinforcing metal layer 22 is disposed so as to overlap at least the centers of the long sides of the rectangle, and the reinforcing metal layer 23 is disposed so as to overlap at least the centers of the short sides of the rectangle. For this reason, even when the interface between the insulating layer 10 and the solder resist layer 30 is present at a portion of the opening 30x, it is possible to reduce the generation of cracks and chipping in the insulating layer 10 and the solder resist layer 30.

In the pad structure according to the first comparative example, the generation of cracks and chipping becomes notable in a case where the difference between the coefficient of thermal expansion of the solder resist layer 30 and the coefficient of thermal expansion of the insulating layer 10 is greater than or equal to 10 ppm/° C. For this reason, the pad structure of the wiring board 1 is particularly effective in the case where the difference between the coefficient of thermal expansion of the solder resist layer 30 and the coefficient of thermal expansion of the insulating layer 10 is greater than or equal to 10 ppm/° C.

In addition, when the planar shape of the opening 30x approximates the rectangle, and the reinforcing metal layers 22 and 23 are separated from the four vertices included in the rectangle in the plan view, it is possible to arrange the pads 21 at a high density, as in the embodiments which will be described later. However, it is not essential for the entire reinforcing metal layers 22 and 23 to be separated from the four vertices included in the rectangle. For example, depending on the arrangement of the pads 21, a portion of the reinforcing metal layers 22 and 23 may overlap one of the four vertices in the plan view.

Moreover, in a case where the entirety of the upper and side surfaces of the reinforcing metal layer 22 or 23 is covered with the solder resist layer 30, a delamination may occur at the interface between the solder resist layer 30 and the insulating layer 10, but propagation of the delamination can be reduced by the reinforcing metal layer 22 or 23.

Modification of First Embodiment

In a modification of the first embodiment, an example of the wiring board has a reinforcing metal layer having a different structure. In the modification of the first embodiment, a description of the same constituent elements described in conjunction with the embodiment described above may be omitted.

Figure 5A:
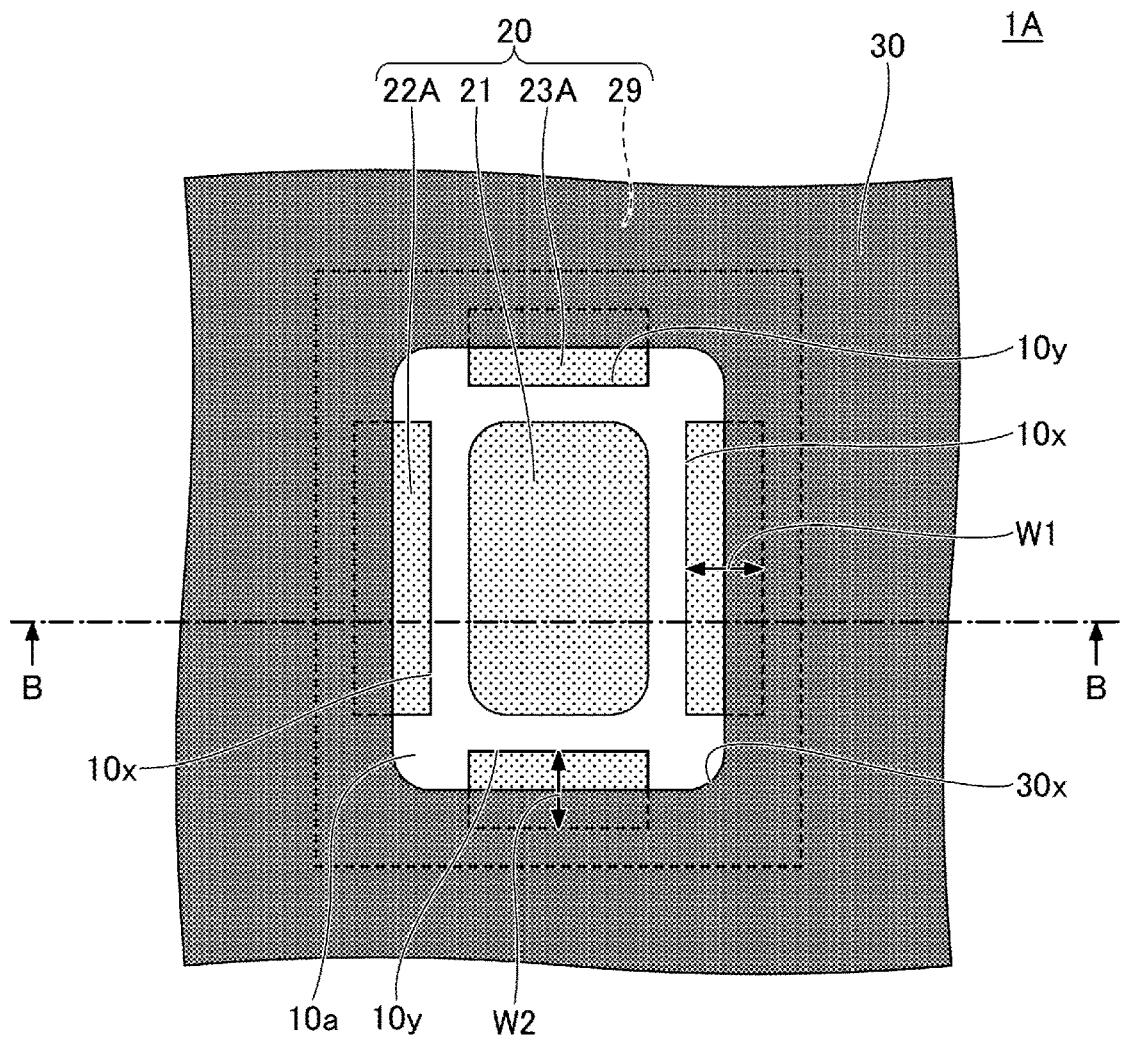
FIG. 5A and FIG. 5B are diagrams illustrating an example of the wiring board according to a modification of the first embodiment.
Figure 5B:
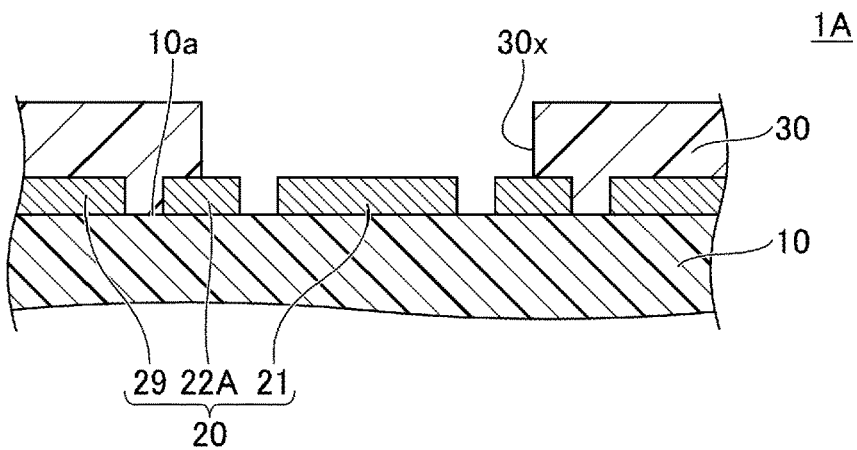

FIG. 5A and FIG. 5B are diagrams illustrating an example of the wiring board according to the modification of the first embodiment. FIG. 5A is a partial plan view of the wiring board and FIG. 5B is a partial cross sectional view along a line B-B in FIG. 5A.

As illustrated in FIG. 5A and FIG. 5B, a wiring board 1A according to the modification of the first embodiment differs from the wiring board 1 (refer to FIG. 1A, FIG. 1B, or the like) in that the reinforcing metal layer 22 is replaced with a reinforcing metal layer 22A, and the reinforcing metal layer 23 is replaced with a reinforcing metal layer 23A. The reinforcing metal layers 22A and 23A are formed on the upper surface 10a of the insulating layer 10. That is, the grooves 10x and 10y are not provided in the insulating layer 10, and the reinforcing metal layers 22A and 23A protrude from the upper surface 10a of the insulating layer 10. With reference to the upper surface 10a of the insulating layer 10, the heights of the reinforcing metal layers 22A and 23A are the same as the heights of the pad 21 and the power supply pattern 29, for example. The planar shapes, the widths, and the materials used for the reinforcing metal layers 22A and 23A may be the same as those of the reinforcing metal layers 22 and 23.

In the solder resist layer 30, a lower end (an end portion on the side of the insulating layer 10) of a portion of the inner side surface of the opening 30x makes contact with the upper surface of the reinforcing metal layer 22A or 23A. That is, a portion (a portion far from the pad 21) of the upper surface of the reinforcing metal layer 22A is covered with the solder resist layer 30, and another portion (a portion close to the pad 21) of the upper surface of the reinforcing metal layer 22A is exposed inside the opening 30x of the solder resist layer 30. In addition, a portion (a portion far from the pad 21) of the side surface of the reinforcing metal layer 22A is covered with the solder resist layer 30, and another portion (a portion close to the pad 21) of the side surface of the reinforcing metal layer 22A is exposed inside the opening 30x of the solder resist layer 30. Similarly, a portion (a portion far from the pad 21) of the upper surface of the reinforcing metal layer 23A is covered with the solder resist layer 30, and another portion (a portion close to the pad 21) of the upper surface of the reinforcing metal layer 23A is exposed inside the opening 30x of the solder resist layer 30. A portion (a portion far from the pad 21) of the side surface of the reinforcing metal layer 23A is covered with the solder resist layer 30, and the other portion (a portion close to the pad 21) is exposed inside the opening 30x of the solder resist layer 30. Moreover, in the solder resist layer 30, a lower end (an end portion on the side of the insulating layer 10) of the other portion of the inner side surface of the opening 30x makes contact with the upper surface 10a of the insulating layer 10.

The wiring board 1A can be manufactured by a manufacturing method similar to that used to manufacture the wiring board 1, except that the grooves 10x and 10y are not provided in the insulating layer 10 in the process or step illustrated in FIG. 2A.

As described above, the reinforcing metal layers 22A and 23A may be formed on the upper surface 10a of the insulating layer 10, without providing the grooves 10x and 10y in the insulating layer 10. The structure of the wiring board 1 and the structure of the wiring board 1A can be used appropriately, as required.

Figure 6A:
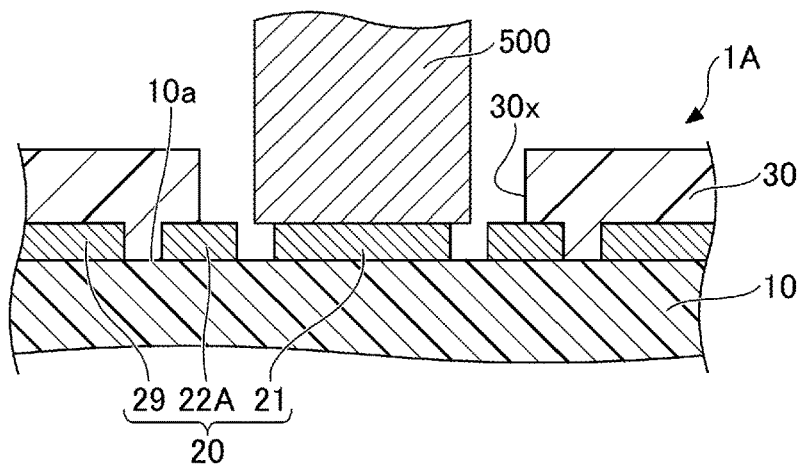
FIG. 6A, FIG. 6B, and FIG. 6C are diagrams for explaining bonding between a pad and a pin.
Figure 6B:
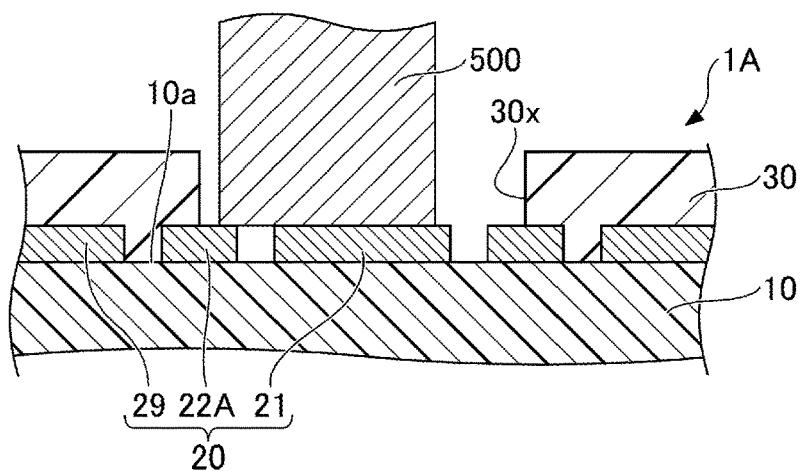
Figure 6C:
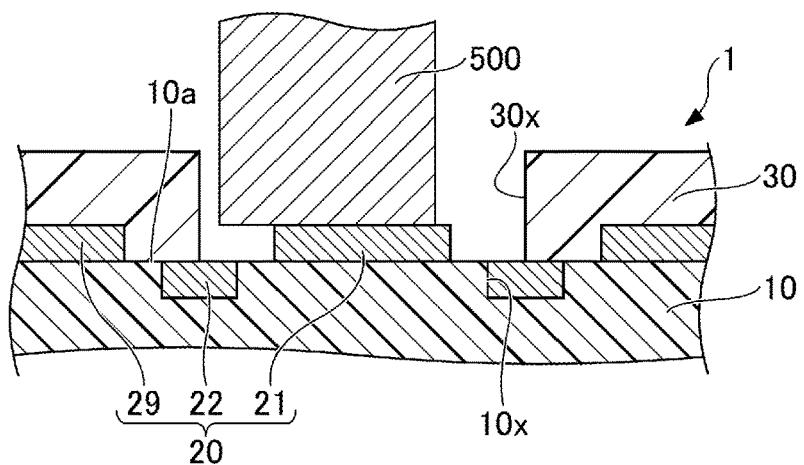

Solder may be used for the electrical connection between the pad 21 and another board or the like, or a pin 500 of a CPU socket illustrated in FIG. 6A, FIG. 6B, and FIG. 6C may be used for the electrical connection between the pad 21 and the other board or the like. In the case where the wiring board 1A is used, the pin 500 may make contact with only the pad 21 as illustrated in FIG. 6A, or the position of the pin 500 may be shifted to make contact with the pad 21 and the reinforcing metal layer 22A as illustrated in FIG. 6B. In the case illustrated in FIG. 6B, because the reinforcing metal layer 22A assumes the same potential as the pad 21, it is substantially equivalent to reducing the pitch (or spacing) between the adjacent pads 21, and the insulating reliability between the pads 21 may deteriorate. Similarly, the pin 500 may make contact with the pad 21 and the reinforcing metal layer 23A. In this case, because the reinforcing metal layer 23A assumes the same potential as the pad 21, it is substantially equivalent to reducing the pitch (or spacing) between the adjacent pads 21, and the insulating reliability between the pads 21 may deteriorate.

As illustrated in FIG. 6C, in the case where the wiring board 1 is used, the pin 500 does not make contact with the reinforcing metal layer 22 or 23 even when the position of the pin 500 is shifted, and thus, the reinforcing metal layer 22 or 23 will not assume the same potential as the pad 21. For this reason, the situation where it is substantially equivalent to reducing the pitch (or spacing) between the adjacent pads 21 will not occur, and insulation reliability between the pads 21 can be ensured. Accordingly, in the case where the pin 500 is used for the electrical connection to the pad 21, it is preferable to select the structure of the wiring board 1 in which the heights of the reinforcing metal layers 22 and 23 are lower than the height of the pad 21.

Second Embodiment

In a second embodiment, an example of the wiring board has a reinforcing metal layer having a different structure. In the second embodiment, a description of the same constituent elements described in conjunction with the embodiment described above may be omitted.

Figure 7A:
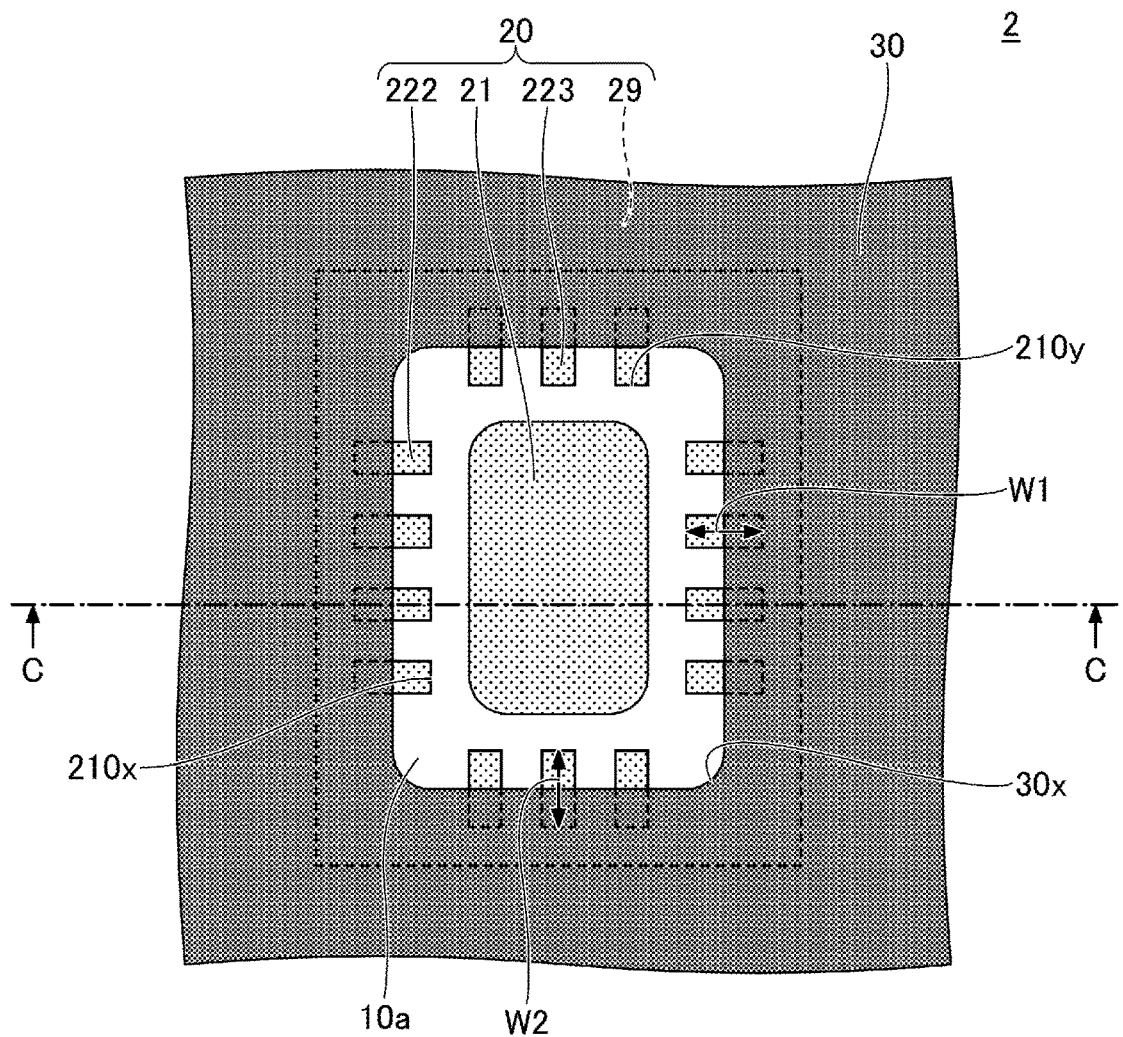
FIG. 7A and FIG. 7B are diagrams illustrating an example of the wiring board according to a second embodiment.
Figure 7B:
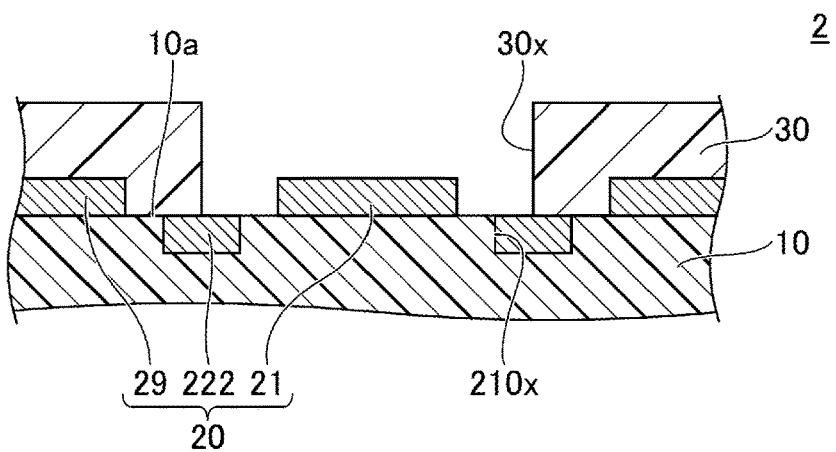

FIG. 7A and FIG. 7B are diagrams illustrating the wiring board according to the second embodiment. FIG. 7A is a partial plan view of the wiring board and FIG. 7B is a partial cross sectional view along a line C-C in FIG. 7A.

As illustrated in FIG. 7A and FIG. 7B, a wiring board 2 according to the second embodiment differs from the wiring board 1 (refer to FIG. 1A, FIG. 1B, or the like) in that the reinforcing metal layer 22 is replaced with a plurality of island-shaped reinforcing metal layers 222, and the reinforcing metal layer 23 is replaced with a plurality of island-shaped reinforcing metal layers 223. The reinforcing metal layers 222 and 223 have a rectangular planar shape, for example. The reinforcing metal layers 222 and 223 are disposed at positions separated from the pad 21 and the power supply pattern 29 in the plan view. In the plan view, the plurality of reinforcing metal layers 222 are disposed adjacent to (or on the sides of) two longest sides (or two long sides) among four sides of a rectangle approximating the planar shape of the pad 21, so as to extend along the two longest sides, respectively. That is, the plurality of reinforcing metal layers 222 are arranged to form two rows. In addition, in the plan view, the plurality of reinforcing metal layers 223 are disposed adjacent to (or on the sides of) two shortest sides (two short sides) among the four sides of the rectangle approximating the planar shape of the pad 21, so as to extend along the two shortest sides, respectively. That is, the plurality of reinforcing metal layers 223 are arranged to form two rows. The reinforcing metal layers 222 are spaced apart from one another and electrically insulated from the power supply pattern 29, and the reinforcing metal layers 223 are spaced apart from one another and electrically insulated from the power supply pattern 29.

In the plan view, a distance between the pad 21 and the reinforcing metal layer 222, and a distance between the pad 21 and the reinforcing metal layer 223, are approximately constant, and is greater than or equal to 10 μm, for example. Further, in the plan view, a distance between the power supply pattern 29 and the reinforcing metal layer 222, and a distance between the power supply pattern 29 and the reinforcing metal layer 223, are greater than or equal to 10 μm, for example.

The plurality of reinforcing metal layers 222 is formed inside a plurality of rectangular grooves 210x that opens at the upper surface 10a of the insulating layer 10. The plurality of reinforcing metal layers 223 is formed inside a plurality of rectangular grooves 210y that opens at the upper surface 10a of the insulating layer 10. The upper surfaces of the reinforcing metal layers 222 and 223 coincide with the upper surface 10a of the insulating layer 10, for example. However, the upper surfaces of the reinforcing metal layers 222 and 223 may protrude from the upper surface 10a of the insulating layer 10, or may be recessed from the upper surface 10a of the insulating layer 10, for example.

Thicknesses, widths W1 and W2, and materials used for the reinforcing metal layers 222 and 223 may be the same as those used for the reinforcing metal layers 22 and 23, respectively. The width W1 of the reinforcing metal layer 222 is a length in a direction perpendicular to the side of the pad 21 along which row of the reinforcing metal layers 222 extends. The width W2 of the reinforcing metal layer 223 is a length in a direction perpendicular to the side of the pad 21 along which row of the reinforcing metal layers 223 extends. In FIG. 7A and FIG. 7B, the length of the reinforcing metal layer 222 in the direction perpendicular to the direction indicated by the width W1 (a vertical direction in FIG. 7A) is smaller than the widths W1, but the length of the reinforcing metal layer 22 in this direction may also be greater than or equal to 10 μm, for example. Similarly, in FIG. 7A and FIG. 7B, the length of the reinforcing metal layer 223 in the direction perpendicular to the direction indicated by the width W2 (a horizontal direction in FIG. 7A) is smaller than the width W2, but the length of the reinforcing metal layer 223 in this direction can also be greater than or equal to 10 μm, for example.

In the solder resist layer 30, a lower end (an end portion on the side of the insulating layer 10) of a portion of the inner side surface of the opening 30x makes contact with the upper surfaces of the reinforcing metal layers 222 or 223. That is, a portion of the reinforcing metal layer 222 (a portion far from the pad 21) is covered with the solder resist layer 30, and another portion (a portion close to the pad 21) is exposed inside the opening 30x of the solder resist layer 30. Similarly, a portion (a portion far from the pad 21) of the reinforcing metal layer 223 is covered with the solder resist layer 30, and another portion (a portion close to the pad 21) is exposed inside the opening 30x of the solder resist layer 30. In addition, in the solder resist layer 30, a lower end (an end portion on the side of the insulating layer 10) of the other portion of the inner side surface of the opening 30x makes contact with the upper surface 10a of the insulating layer 10.

For example, in a case where the planar shape of the opening 30x approximates a rectangle, the two rows of the reinforcing metal layers 222 overlap at least the center of the longest side (long side) among the four sides included in this rectangle in the plan view, and the two rows of the reinforcing metal layers 223 overlap at least the center of the shortest side (short side) among the four sides included in this rectangle in the plan view. Further, in the case where the planar shape of the opening 30x approximates the rectangle, the reinforcing metal layers 222 and 223 may be separated from the four vertices included in this rectangle in the plan view. For example, a longitudinal direction of the row formed by the plurality of reinforcing metal layers 222 is parallel to the long side of the rectangle, and a longitudinal direction of the row formed by the plurality of reinforcing metal layer 223 is parallel to the short side of the rectangle. In the plan view, the longitudinal direction of the row formed by the plurality of reinforcing metal layers 222 and the longitudinal direction of the row formed by the plurality of reinforcing metal layers 223 are perpendicular to each other.

Otherwise, the configuration of the second embodiment is the same as that of the first embodiment.

The wiring board 2 can be manufactured by a manufacturing method similar to that used to manufacture the wiring board 1, except that the grooves 210x and 210y are formed in the insulating layer 10 in place of the grooves 10x and 10y in the process or step illustrated in FIG. 2A.

Similar to the first embodiment, the generation of cracks and chipping in the insulating layer 10 and the solder resist layer 30 can also be reduced according to the second embodiment. As a result, it is possible to ensure the insulation reliability between the adjacent pads 21, and the electrical connection reliability between the wiring board 2 and the semiconductor chip, another board or the like.

Third Embodiment

In a third embodiment, an example of the wiring board has a different arrangement of the pad or the like. In the third embodiment, a description of the same constituent elements described in conjunction with the embodiments described above may be omitted.

Figure 8:
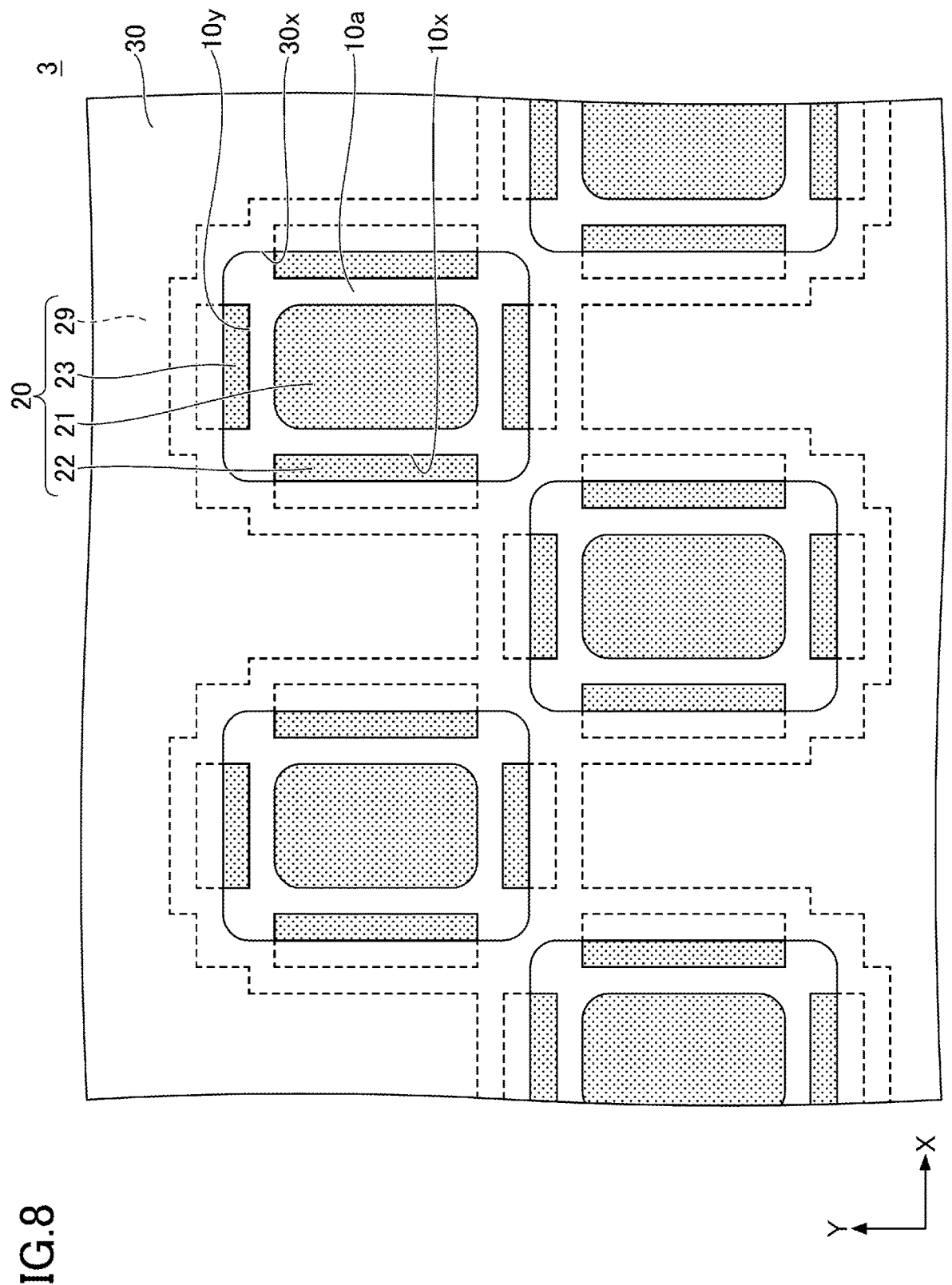
FIG. 8 is a diagram illustrating an example of the wiring board according to a third embodiment.

FIG. 8 is a diagram illustrating an example of the wiring board according to the third embodiment. FIG. 8 is a partial plan view of the wiring board.

As illustrated in FIG. 8, in a wiring board 3 according to the third embodiment, a plurality of pads 21 is arranged in two rows along an X-axis direction parallel to the upper surface 10a of the insulating layer 10. A transverse direction of the pad 21 is parallel to the X-axis direction, and a longitudinal direction of the pad 21 is parallel to a Y-axis direction that is perpendicular to the X-axis direction. The Y-axis direction is also parallel to the upper surface 10a of the insulating layer 10. A first row of the pads 21 is located at a position adjacent to a second row of the pads 21 located at a position on a positive side of the Y-axis direction. The pads 21 in each of the first row and the second row are arranged at a constant pitch (or spacing) along the X-axis direction. Between the two adjacent first and second rows of the pads 21, the positions of the pads 21 in the first row are shifted by one-half the constant pitch (hereinafter also referred to as "one-half pitch") along the X-axis direction with respect to the positions of the pads 21 in the second row that is adjacent to the first row on a negative side along the Y-axis direction.

The solder resist layer 30 has a plurality of openings 30x, and one pad 21 is completely exposed inside each of the openings 30x. Further, similar to the first embodiment, in the solder resist layer 30, a lower end (end portion on the side of the insulating layer 10) of a portion of the inner side surface of the opening 30x makes contact with the upper surface of the reinforcing metal layer 22 or 23, and a lower end (end portion on the side of the insulating layer 10) of another portion of the inner side surface of the opening 30x makes contact with the upper surface 10a of the insulating layer 10.

The reinforcing metal layer 22 located at a position on a positive side of the X-axis direction with respect to the pad 21 forming the second row located at the position on the negative side of the Y-axis direction, and the reinforcing metal layer 22 located at a position on a negative side of the X-axis direction with respect to the pad 21 forming the first row located at the position on the positive side of the Y-axis direction, shifted by one-half pitch in the positive side of the X-axis direction with respect to the pad 21 forming the second row, are arranged side by side along a straight imaginary line in the Y-axis direction. Similarly, the reinforcing metal layer 22 located at a position on the negative side of the X-axis direction with respect to the pad 21 forming the second row located at the position on the negative side of the Y-axis direction, and the reinforcing metal layer 22 located at a position on the positive side of the X-axis direction with respect to the pad 21 forming the first row located at the position on the positive side of the Y-axis direction, shifted by one-half pitch in the negative side of the X-axis direction with respect to the pad 21 forming the second row, are arranged side by side along a straight imaginary line in the Y-axis direction.

Moreover, the reinforcing metal layer 23 located at a position on the positive side of the Y-axis direction with respect to pad 21 forming the second row located at the position on the negative side of the Y-axis direction, and the reinforcing metal layer 23 located at a position on the negative side of the Y-axis direction with respect to the pad 21 forming the first row located at the position on the positive side of the Y-axis direction, are arranged side by side along a straight imaginary line in the X-axis direction.

Figure 9:
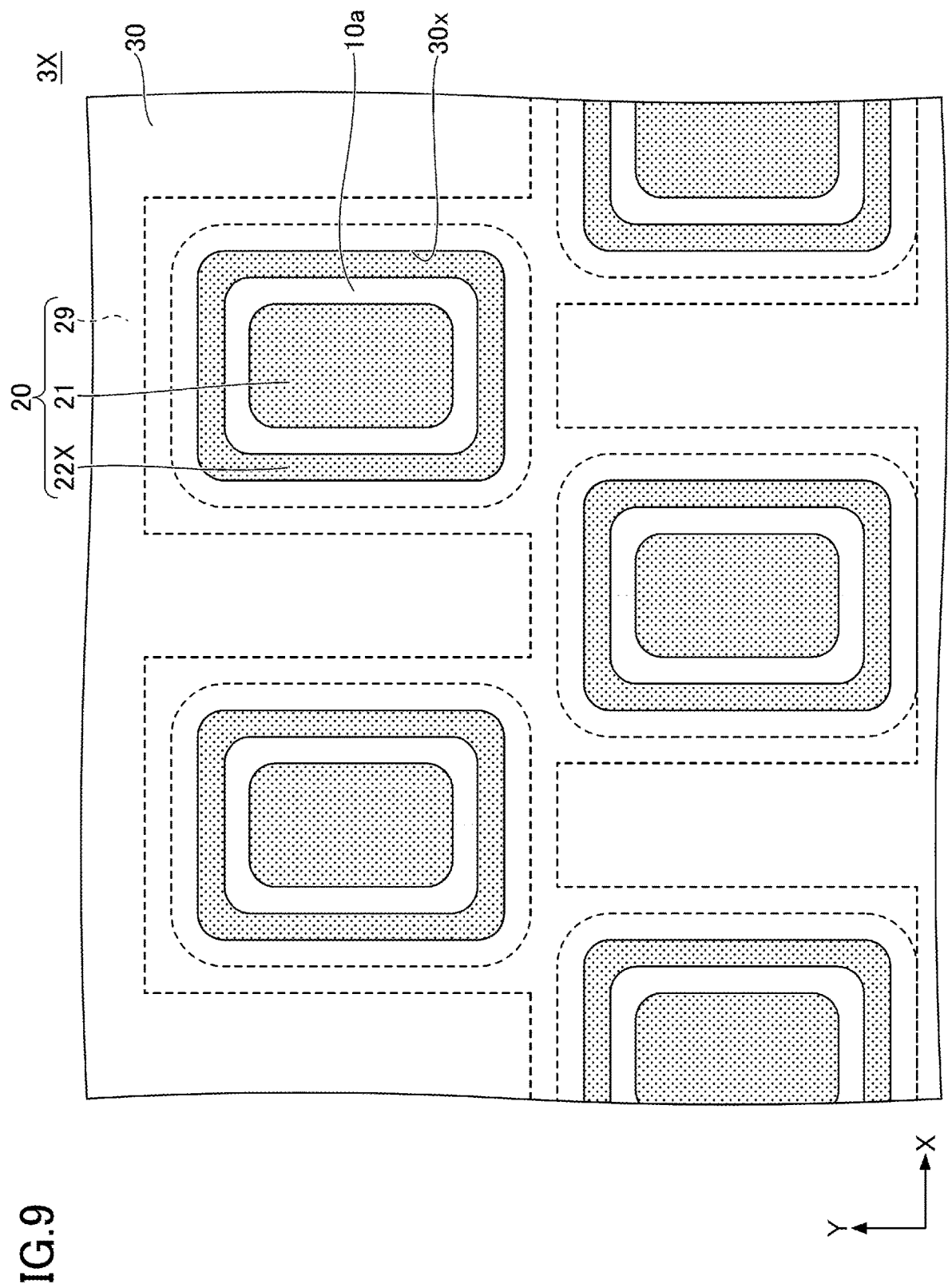
FIG. 9 is a diagram illustrating an example of the wiring board according to a second comparative example.

Next, effects or features obtainable by the wiring board 3 will be described, with reference to a second comparative example. FIG. 9 is a diagram illustrating an example of the wiring board according to the second comparative example. A wiring board 3X illustrated in FIG. 9 differs from the wiring board 3 (refer to FIG. 8) in that a reinforcing metal layer 22X having an annular planar shape is provided in place of the reinforcing metal layers 22 and 23 for each pad 21. In the solder resist layer 30 of the wiring board 3X according to the second comparative example, the entire lower end (the end portion on the side of the insulating layer 10) of the inner side surface of the opening 30x makes contact with an upper surface of the reinforcing metal layer 22X, and the lower end (the end portion on the side of the insulating layer 10) of the inner side surface of the opening 30x does not have a portion making contact with the upper surface 10a of the insulating layer 10.

In the wiring board 3X, a portion of the reinforcing metal layer 22X located at a position on the positive side of the X-axis direction, among the reinforcing metal layers 22X provided with respect to the pads 21 forming the second row located at the position on the negative side of the Y-axis direction, and a portion of the reinforcing metal layer 22X located at a position on the negative side of the X-axis direction, among the reinforcing metal layers 22X provided with respect to the pads 21 forming the first row located at the position on the positive side of the Y-axis direction, shifted by one-half pitch in the positive side of the X-axis direction with respect to the pad 21 forming the second row, are arranged side by side along a straight imaginary line in the Y-axis direction. Similarly, a portion of the reinforcing metal layer 22X located at a position on the negative side of the X-axis direction, among the reinforcing metal layers 22X provided with respect to the pads 21 forming the second row located at the position on the negative side of the Y-axis direction, and a portion of the reinforcing metal layer 22X located at a position on the positive side of the X-axis direction, among the reinforcing metal layers 22X provided with respect to the pads 21 forming the first row located at the position on the positive side in the Y-axis direction, shifted by one-half pitch in the negative side of the X-axis direction with respect to the pad 21 forming the second row, are arranged side by side along a straight imaginary line in the Y-axis direction.

On the other hand, unlike the wiring board 3, the portion of the reinforcing metal layer 22X located at the position on the positive side of the Y-axis direction and provided with respect to the plurality of pads 21 forming the second row located at the position on the negative side of the Y-axis direction, is located on the negative side of the Y-axis direction relative to the portion of the reinforcing metal layer 22X located at the position on the negative side of the Y-axis direction and provided with respect to the plurality of pads 21 forming the first row located at the position on the positive side of the Y-axis direction.

Accordingly, in the wiring board 3 according to the third embodiment, the pads 21 can be arranged at a high density compared to the wiring board 3X according to the second comparative example.

Fourth Embodiment

In a fourth embodiment, an example of the wiring board has a different arrangement of the pad or the like. In the fourth embodiment, a description of the same constituent elements described in conjunction with the embodiments described above may be omitted.

Figure 10:
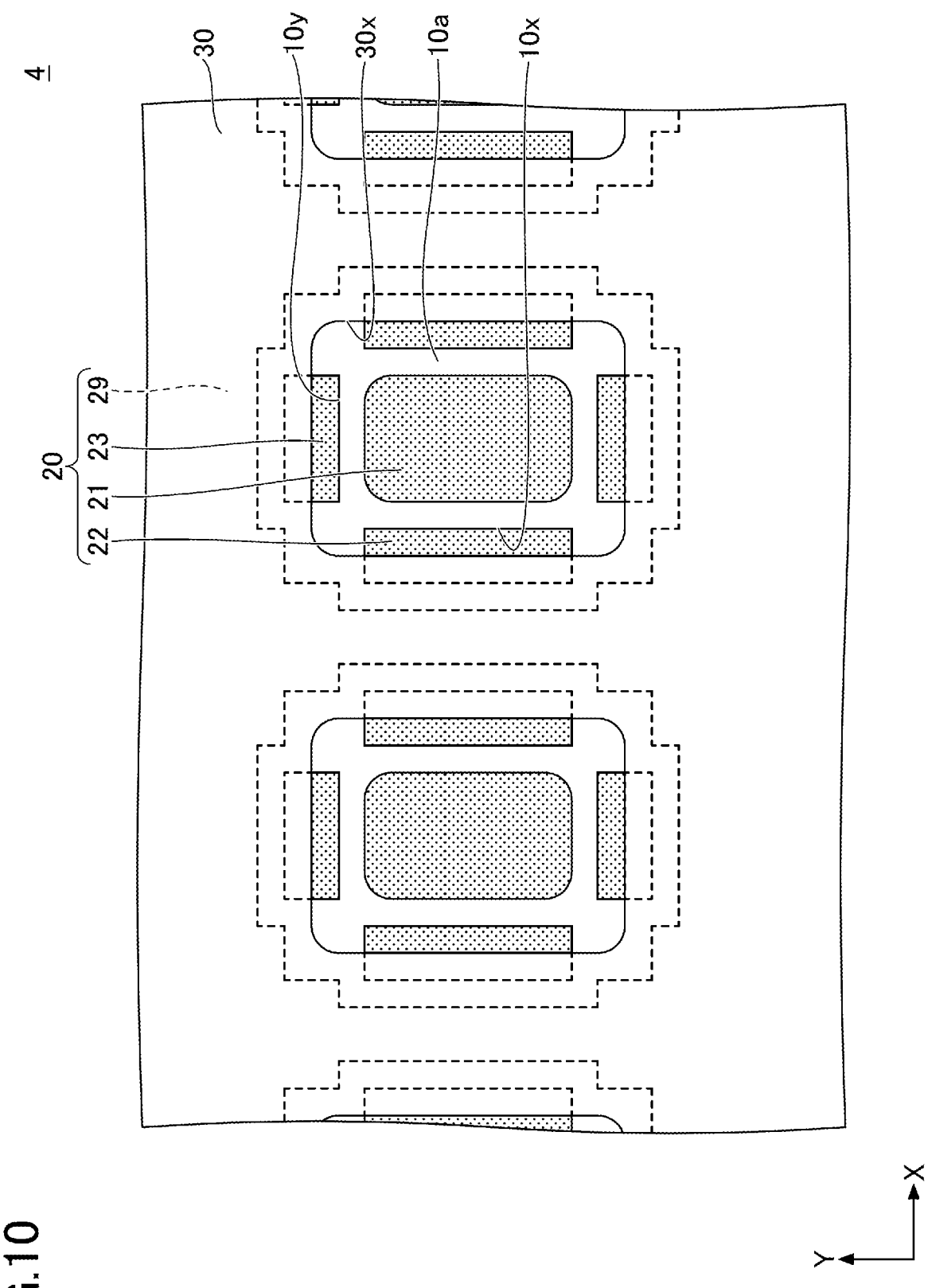
FIG. 10 is a diagram illustrating an example of the wiring board according to a fourth embodiment.

FIG. 10 is a diagram illustrating an example of the wiring board according to the fourth embodiment. FIG. 10 is a partial plan view of the wiring board.

As illustrated in FIG. 10, in a wiring board 4 according to the fourth embodiment, a plurality of pads 21 is arranged in one row in the X-axis direction parallel to the upper surface 10a of the insulating layer 10. A transverse direction of the pad 21 is parallel to the X-axis direction, and a longitudinal direction of the pad 21 is parallel to the Y-axis direction that is perpendicular to the X-axis direction. The Y-axis direction is also parallel to the upper surface 10a of the insulating layer 10.

The solder resist layer 30 has a plurality of openings 30x, and one pad 21 is completely exposed inside each of the openings 30x. Similar to the first embodiment, in the solder resist layer 30, the lower end (the end portion on the side of the insulating layer 10) of a portion of the inner side surface of the opening 30x makes contact with the upper surface of the reinforcing metal layer 22 or 23, and the lower end (the end portion on the side of the insulating layer 10) of another portion of the inner side surface of the opening 30x makes contact with the upper surface 10a of the insulating layer 10.

In the fourth embodiment, one row is formed by the plurality of pads 21. For this reason, the pitch of the pads 21 in the X-axis direction can be made narrower than that of the third embodiment.

Fifth Embodiment

In a fifth embodiment, an example of the wiring board has a different arrangement of the reinforcing metal layers. In the fifth embodiment, a description of the same constituent elements described in conjunction with the embodiments described above may be omitted.

Figure 11:
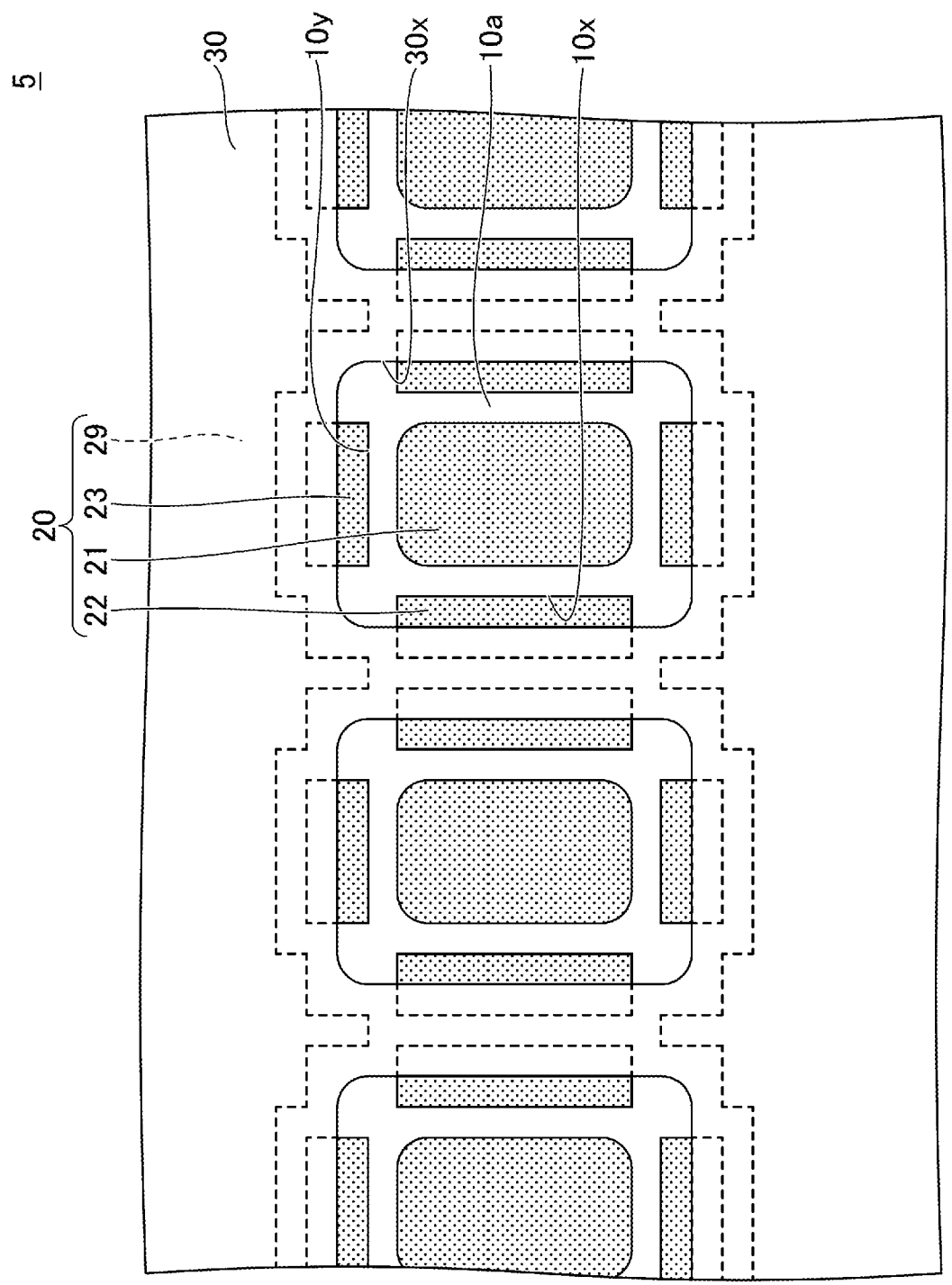
FIG. 11 is a diagram illustrating an example of the wiring board according to a fifth embodiment.

FIG. 11 is a diagram illustrating an example of the wiring board according to the fifth embodiment. FIG. 11 is a partial plan view of the wiring board.

As illustrated in FIG. 11, in a wiring board 5 according to the fifth embodiment, a plurality of pads 21 are arranged in one row in the X-axis direction parallel to the upper surface 10a of the insulating layer 10. A transverse direction of the pad 21 is parallel to the X-axis direction, and a longitudinal direction of the pad 21 is parallel to the Y-axis direction that is perpendicular to the X-axis direction. The Y-axis direction is also parallel to the upper surface 10a of the insulating layer 10.

The solder resist layer 30 has a plurality of openings 30x, and one pad 21 is completely exposed inside each of the openings 30x. Similar to the first embodiment, in the solder resist layer 30, the lower end (the end portion on the side of the insulating layer 10) of a portion of the inner side surface of the opening 30x makes contact with the upper surface of the reinforcing metal layer 22 or 23, and the lower end (the end portion on the side of the insulating layer 10) of another portion of the inner side surface of the opening 30x makes contact with the upper surface 10a of the insulating layer 10.

In the wiring board 4 according to the fourth embodiment, a portion of the power supply pattern 29 is present between the reinforcing metal layers 22 adjacent to each other in the X-axis direction. In contrast, in the wiring board 5 according to the fifth embodiment, the power supply pattern 29 is not present between the reinforcing metal layers 22 adjacent to each other in the X-axis direction. For this reason, according to the fifth embodiment, the pitch of the pads 21 in the X-axis direction can be made narrower than that of the fourth embodiment.

Sixth Embodiment

In a sixth embodiment, an example of the wiring board has a different arrangement of the reinforcing metal layers. In the sixth embodiment, a description of the same constituent elements described in conjunction with the embodiments described above may be omitted.

Figure 12:
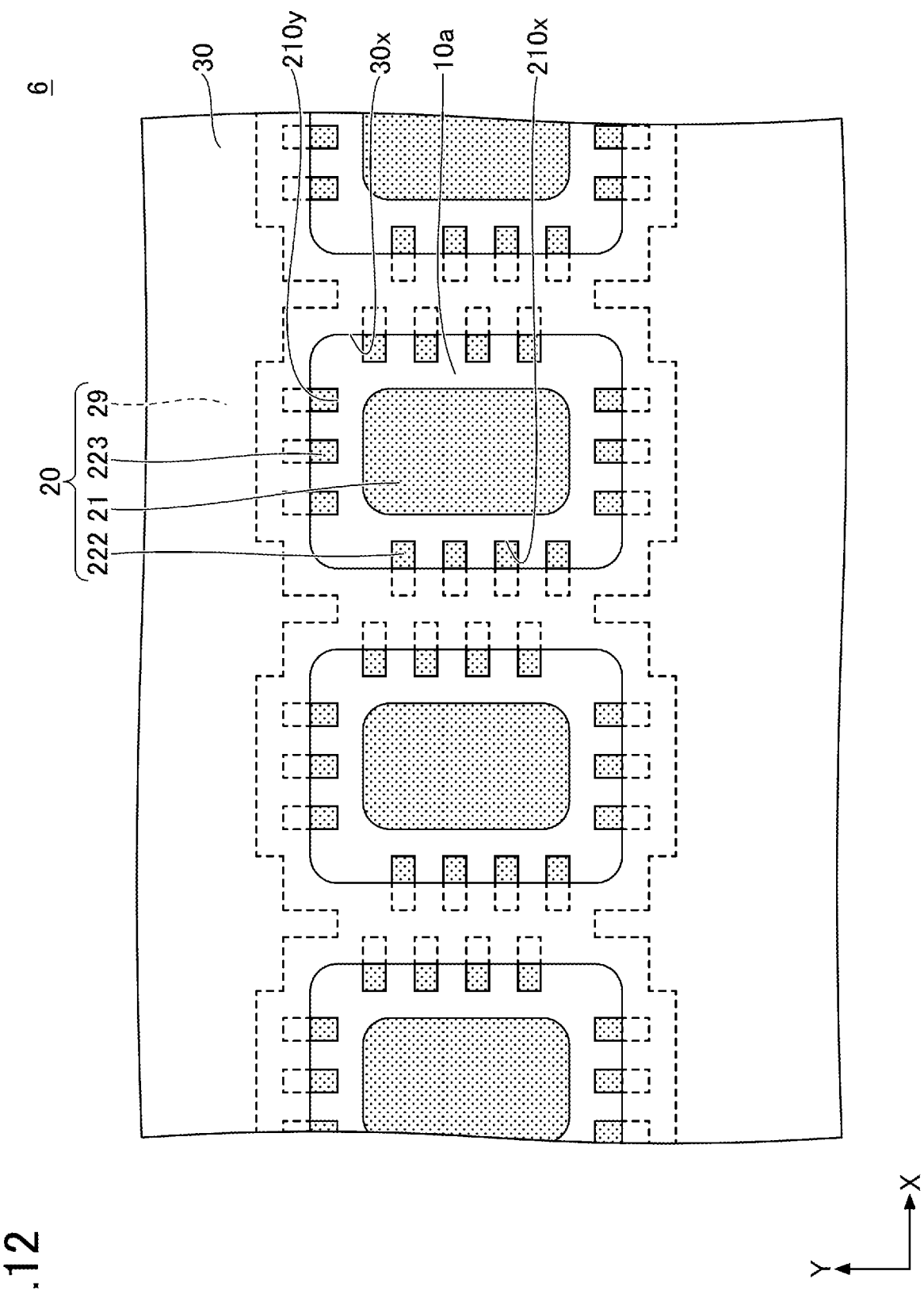
FIG. 12 is a diagram illustrating an example of the wiring board according to a sixth embodiment.

FIG. 12 is a diagram illustrating an example of the wiring board according to the sixth embodiment. FIG. 12 is a partial plan view of the wiring board.

As illustrated in FIG. 12, a wiring board 6 according to the sixth embodiment differs from the wiring board 5 (refer to FIG. 11) in that the reinforcing metal layer 22 is replaced with a plurality of island-shaped reinforcing metal layers 222, and the reinforcing metal layer 23 is replaced with a plurality of island-shaped reinforcing metal layers 223.

The reinforcing metal layers 222 are arranged at a constant pitch in rows along the Y-axis direction. However, between two adjacent rows of the reinforcing metal layers 222 disposed between two pads 21 that are adjacent to each other in the X-axis direction, the arrangement of the reinforcing metal layers 222 is shifted by one-half pitch.

In a case where a distance between adjacent conductive layers on a plane parallel to the upper surface 10a of the insulating layer 10 has a lower limit, that is, in the case where a shortest distance between the conductive layers is determined by a design rule, the pitch of the pads 21 in the X-axis direction according to the sixth embodiment can be made narrower than that of the fifth embodiment. For example, the distance between two rows of the reinforcing metal layers 222 adjacent to each other in the X-axis direction according to the sixth embodiment, can be 1/√2 times the distance between two reinforcing metal layers 22 adjacent to each other in the X-axis direction according to the fifth embodiment.

Seventh Embodiment

In a seventh embodiment, an example of the wiring board has a different arrangement of the reinforcing metal layers. In the seventh embodiment, a description of the same constituent elements described in conjunction with the embodiments described above may be omitted.

Figure 13:
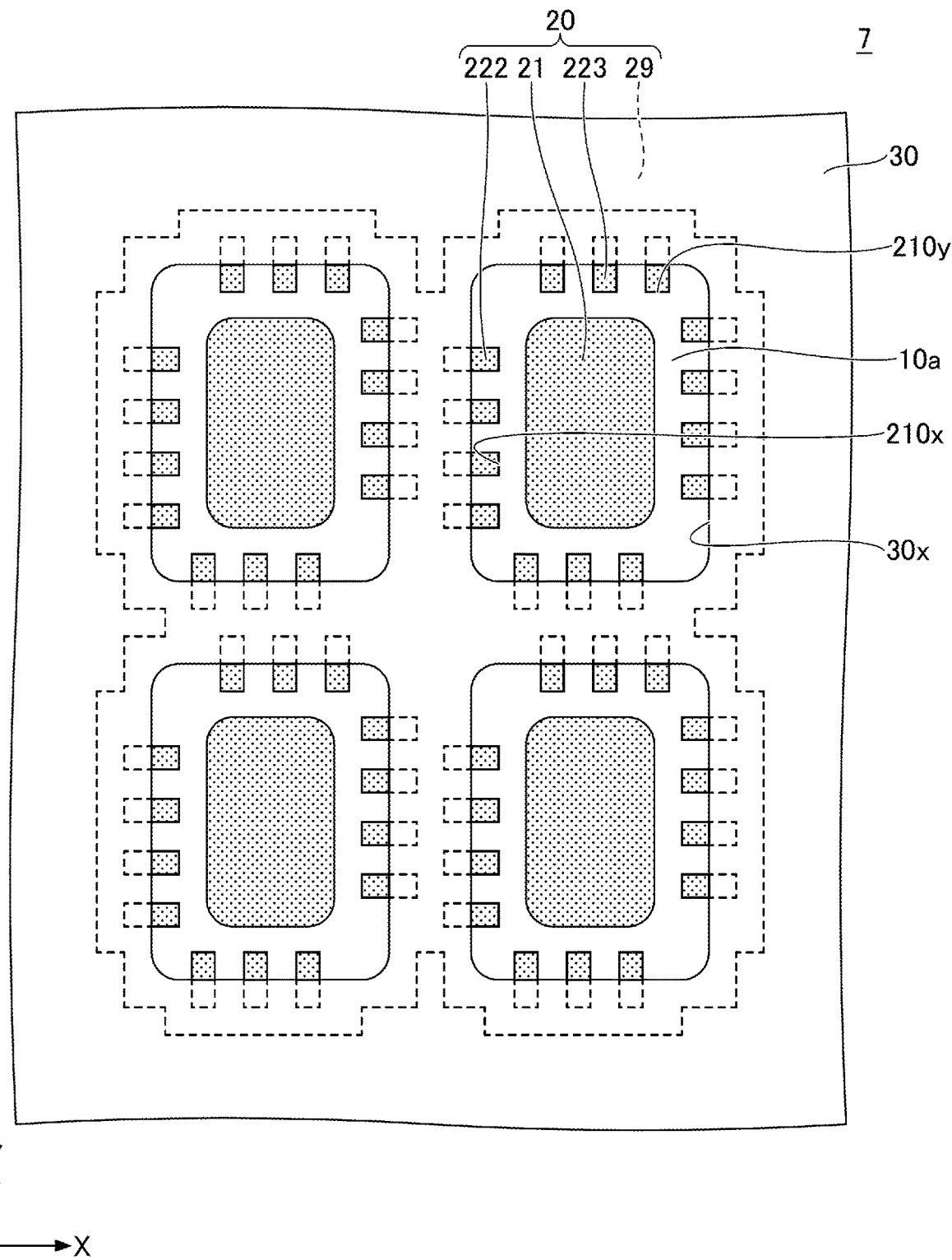
FIG. 13 is a diagram illustrating an example of the wiring board according to a seventh embodiment.

FIG. 13 is a diagram illustrating an example of the wiring board according to the seventh embodiment. FIG. 13 is a partial plan view of the wiring board.

As illustrated in FIG. 13, a wiring board 7 according to the seventh embodiment includes four pads 21 located at positions corresponding to vertices of a square lattice in the plan view. A plurality of island-shaped reinforcing metal layers 222 and 223 are provided around each of the pads 21 in the plan view.

The reinforcing metal layers 222 are arranged at a constant pitch in rows along the Y-axis direction. However, between two adjacent rows of the reinforcing metal layers 222 disposed between two pads 21 that are adjacent to each other in the X-axis direction, the arrangement of the reinforcing metal layers 222 is shifted by one-half pitch. In addition, the reinforcing metal layers 222 are arranged at a constant pitch in rows along the X-axis direction. However, between two adjacent rows of the reinforcing metal layers 223 disposed between two pads 21 that are adjacent to each other in the Y-axis direction, the arrangement of the reinforcing metal layers 223 is shifted by one-half pitch.

Similar to the sixth embodiment, it is possible to narrow the pitch of the pads 21 in the X-axis direction according to the seventh embodiment, when compared to the case where the reinforcing metal layer 22 is provided instead of the reinforcing metal layer 222. For example, the distance between two rows of the reinforcing metal layers 222 adjacent to each other in the X-axis direction according to the seventh embodiment, can be 1/√2 times the distance between two reinforcing metal layers 22 adjacent to each other in the X-axis direction. In addition, the pitch of the pads 21 in the Y-axis direction can be made narrower than that of the case where the reinforcing metal layer 23 is provided instead of the reinforcing metal layer 223. For example, the distance between two rows of the reinforcing metal layers 223 adjacent to each other in the Y-axis direction according to the seventh embodiment, can be 1/√2 times the distance between two reinforcing metal layers 23 adjacent to each other in the Y-axis direction.

Eighth Embodiment

In an eighth embodiment, an example of the wiring board has a different arrangement of the reinforcing metal layers. In the eighth embodiment, a description of the same constituent elements described in conjunction with the embodiments described above may be omitted.

Figure 14:
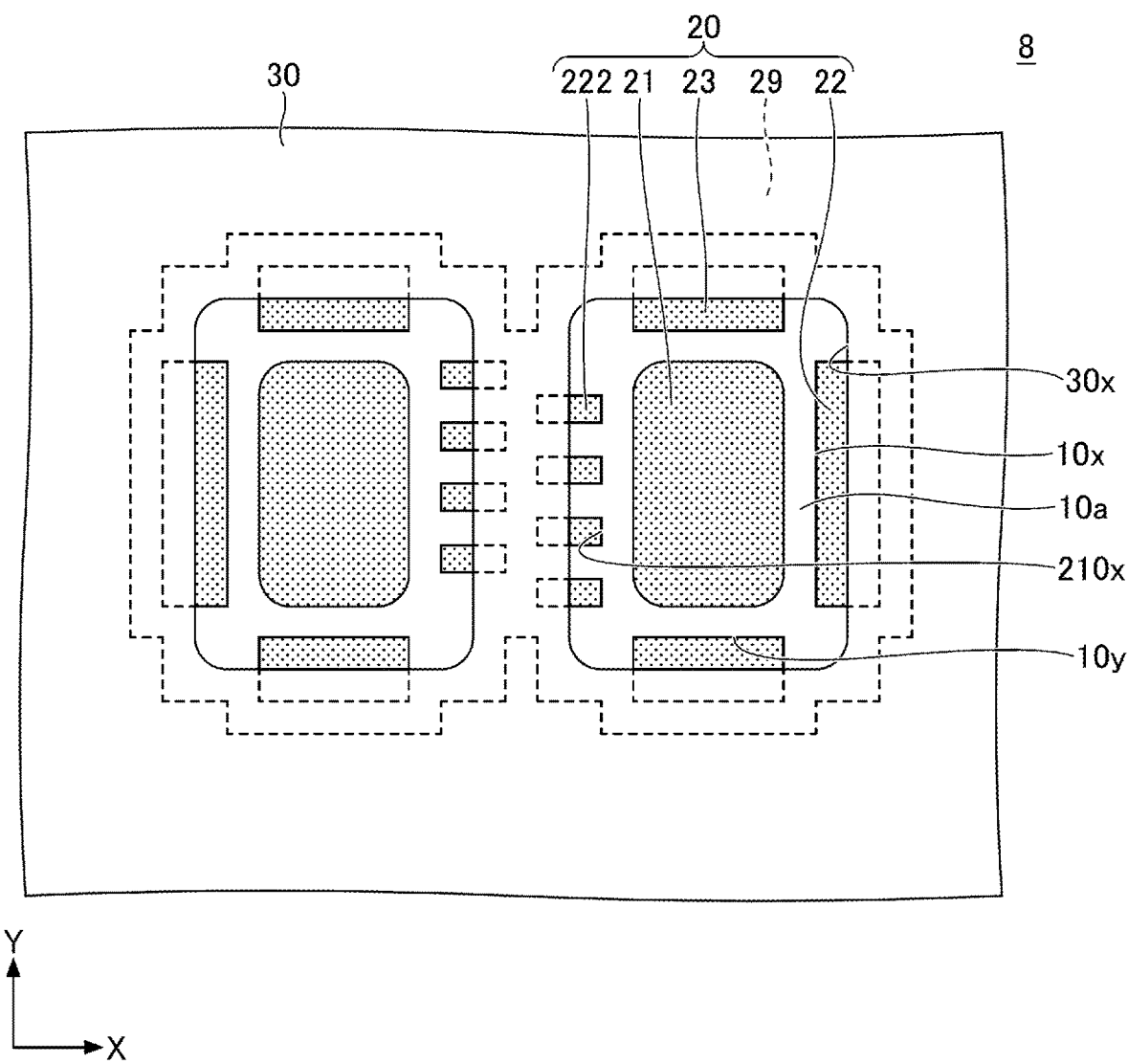
FIG. 14 is a diagram illustrating an example of the wiring board according to an eighth embodiment.

FIG. 14 is a diagram illustrating an example of the wiring board according to the eighth embodiment. FIG. 14 is a partial plan view of the wiring board.

As illustrated in FIG. 14, a wiring board 8 according to the eighth embodiment includes two pads 21 arranged in the X-axis direction. In addition, in the plan view, two rows of a plurality of island-shaped reinforcing metal layers 222 are provided between the two pads 21. Moreover, the reinforcing metal layer 22 is provided on the positive side of the X-axis direction with respect to the pad 21 that is disposed on the positive side of the X-axis direction, and the reinforcing metal layer 22 is also provided on the negative side of the X-axis direction with respect to the pad 21 that is disposed on the negative side of the X-axis direction. Further, with respect to each of the pads 21, the reinforcing metal layer 23 is provided on the positive side of the Y-axis direction, and also on the negative side of the Y-axis direction of each pad 21.

The reinforcing metal layers 222 are arranged at a constant pitch in rows along the Y-axis direction. However, between two adjacent rows of the reinforcing metal layers 222 disposed between two pads 21 that are adjacent to each other in the X-axis direction, the arrangement of the reinforcing metal layers 222 is shifted by one-half pitch.

According to the eighth embodiment, it is possible to narrow the pitch of the pads 21 in the X-axis direction compared to the case where the reinforcing metal layer 22 is provided instead of the reinforcing metal layer 222. Further, it is possible to more positively reduce the generation of cracks at the portion where the reinforcing metal layer 22 or 23 is provided.

As described above, the reinforcing metal layer 222 or 223, and the reinforcing metal layer 22 or 23, may coexist. That is, when viewed from a certain pad 21, the reinforcing metal layer 222 or 223 may be provided in a direction in which an adjacent pad 21 is present, and the reinforcing metal layer 22 or 23 may be provided in the other direction.

In the present disclosure, a length of a minor axis of an oval shape, obtained by approximating the planar shape of the reinforcing metal layer, is preferably greater than or equal to 10 μm, more preferably greater than or equal to 15 μm, and still more preferably greater than or equal to 20 μm. This is because the lower end of the inner side surface of the opening designed to make contact with the upper surface of the reinforcing metal layer, may make contact with the upper surface of the insulating layer instead of the reinforcing metal layer due to misalignment or the like, if the reinforcing metal layer is excessively small in the plan view. That is, the length of the minor axis of the oval shape is set so as to ensure a sufficiently large margin with respect to the misalignment or the like. In addition, if the reinforcing metal layer is excessively small in the plan view, the seed layer 201 that is to remain may also be removed, thereby not being able to form the reinforcing metal layer that is to be formed, when removing the seed layer 201 to form the reinforcing metal layer (refer to FIG. 3B).

Moreover, a distance between the reinforcing metal layer and the pad or the power supply pattern is preferably greater than or equal to 10 μm, more preferably greater than or equal to 30 μm, and still more preferably greater than or equal to 60 μm. As described above, a surface treated layer, such as an Au layer or the like, may be formed on the upper surface of the pad or the reinforcing metal layer. In this case, after the surface treated layer is formed by electroless plating, the upper surface of the insulating layer is subjected to a surface etching by plasma (dry desmear process) or a wet desmear process using permanganate. The desmear process is performed in order to prevent an electrical short circuit caused by a metal deposited on the upper surface of the insulating layer. However, if the distance between the reinforcing metal layer and the pad or the power supply pattern is excessively short, it may not be possible to sufficiently remove the metal deposited on the upper surface of the insulating layer.

Ninth Embodiment

In a ninth embodiment, an example of a multilayer wiring board has the pad structure of the wiring board 1. In the ninth embodiment, a description of the same constituent elements described in conjunction with the embodiments described above may be omitted.

Figure 15:
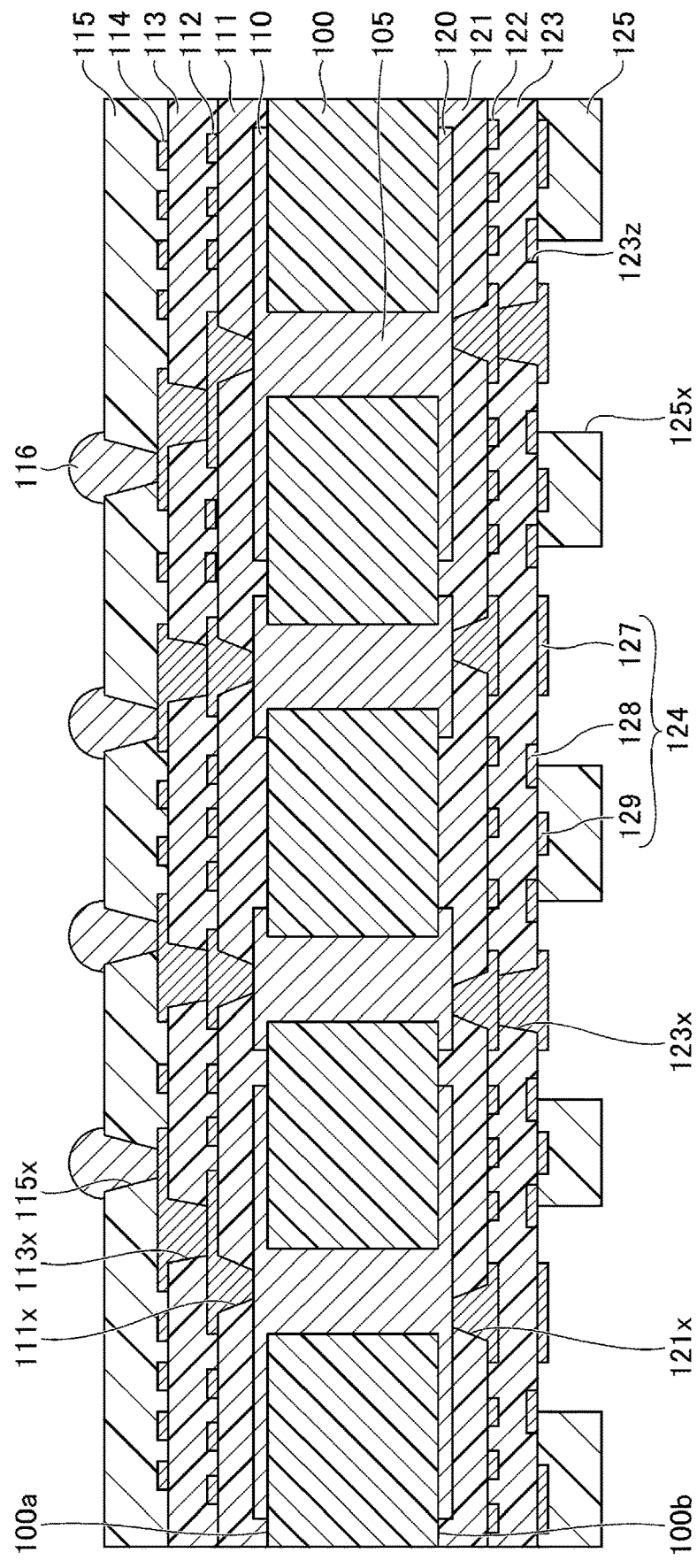
FIG. 15 is a cross sectional view illustrating an example of a multilayer wiring board according to a ninth embodiment.

FIG. 15 is a cross sectional view illustrating an example of the multilayer wiring board according to the ninth embodiment.

As illustrated in FIG. 15, a multilayer wiring board 9 according to the ninth embodiment includes an interconnect layer 110, an insulating layer 111, an interconnect layer 112, an insulating layer 113, an interconnect layer 114, and a solder resist layer 115 that are successively laminated on one surface 100a of a core layer 100. In addition, the multilayer wiring board 9 includes an interconnect layer 120, an insulating layer 121, an interconnect layer 122, an insulating layer 123, an interconnect layer 124, and a solder resist layer 125 that are successively laminated on the other surface 100b of the core layer 100.

For example, a so-called glass epoxy substrate or the like, in which glass cloth is impregnated with an insulating resin, such as an epoxy-based resin, a polyimide-based resin, or the like, can be used for the core layer 100. A substrate or the like having a woven fabric or a nonwoven fabric of glass fiber, carbon fiber, aramid fiber, or the like impregnated with the insulating resin, such as the epoxy-based resin or the like, can also be used for the core layer 100.

The interconnect layer 110 is formed on one surface 100a of the core layer 100. The interconnect layer 110 is electrically connected to the interconnect layer 120 through a via interconnect 105 penetrating the core layer 100. A material used for the interconnect layer 110 is copper (Cu) or the like, for example. The insulating layer 111 is formed on one surface 100a of the core layer 100, so as to cover the interconnect layer 110. For example, a material used for the insulating layer 111 can be an insulating resin or the like including an epoxy-based resin or a polyimide-based resin as a main component thereof. A thickness of the insulating layer 111 may be in a range of approximately 10 μm to approximately 50 μm, for example. The insulating layer 111 may include a filler, such as silica ($SiO_2$) or the like.

The interconnect layer 112 is formed on one side of the insulating layer 111. The interconnect layer 112 includes a via interconnect filling a via hole 111x that penetrates the insulating layer 111 and exposes an upper surface of the interconnect layer 110, and an interconnect pattern formed on an upper surface of the insulating layer 111. The interconnect pattern of the interconnect layer 112 is electrically connected to the interconnect layer 110 through the via interconnect. The via hole 1/1x may be a cavity having an inverted truncated cone shape, and a diameter of an opening of the cavity at one end which opens to the insulating layer 113 is greater than a diameter of an opening of the cavity at the other end (that is, a bottom surface of the cavity) formed by an upper surface of the interconnect layer 110, for example. A material used for the interconnect layer 112 is copper (Cu) or the like, for example.

The insulating layer 113 is formed on the upper surface of the insulating layer 111, so as to cover the interconnect layer 112. A material and a thickness used for the insulating layer 113 are the same as those of the insulating layer 111, for example. The insulating layer 113 may include a filler, such as silica ($SiO_2$) or the like.

The interconnect layer 114 is formed on one side of the insulating layer 113. The interconnect layer 114 includes a via interconnect filling a via hole 113x that penetrates the insulating layer 113 and exposes an upper surface of the interconnect layer 112, and an interconnect pattern formed on an upper surface of the insulating layer 113. The interconnect pattern of the interconnect layer 114 is electrically connected to the interconnect layer 112 through the via wiring. The via hole 113x may be a cavity having an inverted truncated cone shape, and a diameter of an opening of the cavity at one end which opens to the solder resist layer 115 is greater than a diameter of an opening of the cavity at the other end (that is, a bottom surface of the cavity) formed by the upper surface of the interconnect layer 112, for example. A material used for the interconnect layer 114 is copper (Cu) or the like, for example.

The solder resist layer 115 is an outermost layer provided on one side of the multilayer wiring board 9, and is an insulating layer formed on the upper surface of the insulating layer 113 so as to cover the interconnect layer 114. For example, the solder resist layer 115 can be formed of a photosensitive resin or the like, such as an epoxy-based resin, an acrylic-based resin, or the like. A thickness of the solder resist layer 115 may be in a range of approximately 5 μm to approximately 40 μm, for example.

The solder resist layer 115 has openings 115x, and a portion of the upper surface of the interconnect layer 114 is exposed at a bottom of each of the openings 115x. A planar shape of the openings 115x is a circular shape, for example. A metal layer may be formed, or an antioxidation treatment, such as the OSP treatment or the like, may be performed, on the upper surface of the interconnect layer 114 exposed inside each of the openings 115x, as required.

External connection terminals 116 are formed on the upper surface of the interconnect layer 114 exposed at the bottoms of the openings 115x. The external connection terminals 116 are solder bumps, for example. For example, a solder material such as an alloy including Pb, an alloy of Sn and Cu, an alloy of Sn and Ag, an alloy of Sn, Ag, and Cu, or the like, can be used for the solder bump. The external connection terminals 116 serve as terminals for making electrical connection to the semiconductor chip.

The interconnect layer 120 is formed on the other surface 100b of the core layer 100. A material used for the interconnect layer 120 is copper (Cu) or the like, for example. The insulating layer 121 is formed on the other surface 100b of the core layer 100, so as to cover the interconnect layer 120. A material and a thickness used for the insulating layer 121 are the same as those of the insulating layer 111, for example. The insulating layer 121 may include a filler, such as silica ($SiO_2$) or the like.

The interconnect layer 122 is formed on the other side of the insulating layer 121. The interconnect layer 122 includes a via interconnect filling a via hole 121x that penetrates the insulating layer 121 and exposes a lower surface of the interconnect layer 120, and an interconnect pattern formed on a lower surface of the insulating layer 121. The interconnect pattern of the interconnect layer 122 is electrically connected to the interconnect layer 120 through the via interconnect. The via hole 121x may be a cavity having a truncated cone shape, and a diameter of an opening of the cavity at one end which opens to the insulating layer 123 is greater than a diameter of an opening of the cavity at the other end (that is, a bottom surface of the cavity) formed by the lower surface of the interconnect layer 120, for example. A material used for the interconnect layer 122 is copper (Cu) or the like, for example.

The insulating layer 123 is formed on the lower surface of the insulating layer 121, so as to cover the interconnect layer 122. A material and a thickness used for the insulating layer 123 are the same as those of the insulating layer 111, for example. The insulating layer 123 may include a filler, such as silica ($SiO_2$) or the like.

The interconnect layer 124 is formed to make contact with the insulating layer 123. The interconnect layer 124 includes at least pads 127, a reinforcing metal layer 128, and a power supply pattern 129. The pads 127 and the power supply pattern 129 are formed on the lower surface of the insulating layer 123, and the reinforcing metal layer 128 is formed inside a groove 123z having a rectangular planar shape and opening to the lower surface of the insulating layer 123. Structures of the pads 127, the reinforcing metal layer 128, and the power supply pattern 129 are the same as the structures (refer to FIG. 1A and FIG. 1B) of the pad 21, the reinforcing metal layer 22 or 23, and the power supply pattern 29 of the wiring board 1. The interconnect layer 124 may have an interconnect pattern or the like, in addition to or separately from the pad 127, the reinforcing metal layer 128, and the power supply pattern 129.

At least some of the pads 127 are electrically connected to the interconnect layer 122 through via interconnects filling via holes 123x that penetrate the insulating layer 123 and expose the lower surface of the interconnect layer 122. The via hole 123x may be a cavity having a truncated cone shape, and a diameter of an opening of the cavity at one end which opens to the solder resist layer 125 is greater than a diameter of an opening of the cavity at the other end (that is, a bottom surface of the cavity) formed by the lower surface of the interconnect layer 122, for example. A material used for the interconnect layer 124 is copper (Cu) or the like, for example.

The solder resist layer 125 is an outermost layer provided on the other side of the multilayer wiring board 9, and is an insulating layer provided on the lower surface of the insulating layer 123. The solder resist layer 125 has openings 125x, and the pad 127 is completely exposed inside each of the openings 125x. The pad 127 is disposed inside the opening 125x, without making contact with the solder resist layer 125. In the solder resist layer 125, an upper end (an end portion on the side of the insulating layer 123) of a portion of the inner side surface of the opening 125x makes contact with a lower surface of the reinforcing metal layer 128. That is, a portion of the reinforcing metal layer 128 (a portion far from the pad 127) is covered with the solder resist layer 125, and another portion of the reinforcing metal layer 128 (a portion close to the pad 127) is exposed inside the opening 125x of the solder resist layer 125. In addition, in the solder resist layer 125, an upper end (an end portion on the side of the insulating layer 123) of another portion of the inner side surface of the opening 125x makes contact with the lower surface of the insulating layer 123.

A material and a thickness of the solder resist layer 125 are the same as those of the solder resist layer 115, for example. The pads 127 exposed inside the openings 125x can be used as pads for making electrical connection to a mounting board such as a mother board or the like. As described above, the metal layer may be formed, or the antioxidation treatment, such as the OSP treatment or the like, may be performed, on the lower surface of the pads 127 exposed inside the openings 125x, as required.

Accordingly, the multilayer wiring board 9 has a pad structure similar to that of the wiring board 1. That is, the multilayer wiring board 9 includes the interconnect layer 124 including the pads 127, the reinforcing metal layer 128, and the power supply pattern 129, and the solder resist layer 125 in which the upper end of a portion of the inner side surface of the opening 125x makes contact with the lower surface of the reinforcing metal layer 128. As a result, similar to the first embodiment, it is possible to reduce the generation of cracks and chipping in the insulating layer 123 and the solder resist layer 125. As a result, the insulation reliability between adjacent pads 127, and the connection reliability with the mounting board such as the mother board or the like, to which the multilayer wiring board 9 is connected, can be ensured.

In this example of the multilayer wiring board 9, the pad structure similar to that of the wiring board 1 is provided on the side to be connected to the mounting board, such as the mother board or the like, but the arrangement is not limited to this example. That is, in the multilayer wiring board 9, the pad structure similar to that of the wiring board 1 may be provided on the semiconductor chip mounting side (the side of the external connection terminals 116).

In addition, the pad structure similar to that of the wiring board 1 may coexist with the SMD pad structure, regardless of whether the pad structure is provided on the side to be connected to the mounting board, such as the mother board or the like, or on the semiconductor chip mounting side. Moreover, the pad structure similar to that of any one of the wiring boards 1A, 2, 3, 4, 5, 6, 7, and 8 may be used, instead of the pad structure similar to that of the wiring board 1.

According to the disclosed technique, it is possible to ensure the insulation reliability of the wiring board having the NSMD structure.

Although preferred embodiments or the like have been described in detail above, the present invention is not limited to the above described embodiments or the like, and various modifications and substitutions can be added to the above described embodiments or the like without departing from the scope described in the claims.

Various aspects of the subject-matter described herein may be set out non-exhaustively in the following numbered clauses:

1. A method for manufacturing a wiring board, comprising:
   forming a pad and a reinforcing metal layer so as to make contact with one surface of a first insulating layer; and
   forming an opening in a second insulating layer by forming the second insulating layer on the one surface of the first insulating layer, so as to cover the pad and the reinforcing metal layer, wherein
   the forming the pad and the reinforcing metal layer forms the reinforcing metal layer around the pad so as to be separated from the pad in a plan view, and
   the forming the opening disposes the pad inside the opening without making contact with the second insulating layer, so that an end, on a side of the first insulating layer, in a portion of an inner side surface of the opening of the second insulating layer makes contact with the reinforcing metal layer, and an end, on the side of the first insulating layer, in another portion of the inner side surface of the opening of the second insulating layer makes contact with the one surface of the first insulating layer.

2. The method for manufacturing the wiring board according to clause 1, further comprising:
   forming, in the first insulating layer, a groove that opens at the one surface of the first insulating layer,
   wherein the forming the pad and the reinforcing metal layer forms the reinforcing metal layer inside the groove.

Although the embodiments are numbered with, for example, "first," "second," . . . or "ninth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
a first insulating layer;
a pad formed on one surface of the first insulating layer;
a second insulating layer, formed on the one surface of the first insulating layer, and including an opening exposing the pad;
a reinforcing metal layer formed in contact with the first insulating layer, and provided around the pad so as to be separated from the pad in a plan view; and
a power supply pattern formed on the one surface of the first insulating layer, wherein:
the pad is disposed inside the opening without making contact with the second insulating layer,
an end, on a side of the first insulating layer, in a portion of an inner side surface of the opening of the second insulating layer makes contact with the reinforcing metal layer,
an end, on the side of the first insulating layer, in another portion of the inner side surface of the opening of the second insulating layer makes contact with the one surface of the first insulating layer, and
the reinforcing metal layer is electrically insulated from the power supply pattern.

2. The wiring board as claimed in claim 1, wherein
a planar shape of the opening approximates a rectangle, and
the reinforcing metal layer overlaps at least a center of a longest side among four sides included in the rectangle in the plan view.

3. The wiring board as claimed in claim 1, wherein
a planar shape of the opening approximates a rectangle, and
the reinforcing metal layer is separated from four vertices included in the rectangle in the plan view.

4. The wiring board as claimed in claim 1, wherein the reinforcing metal layer is formed inside a groove that opens to the one surface of the first insulating layer.

5. The wiring board as claimed in claim 1, wherein a height of the reinforcing metal layer, with reference to the one surface of the first insulating layer, is lower than a height of the pad.

6. The wiring board as claimed in claim 1, wherein the reinforcing metal layer protrudes from the one surface of the first insulating layer.

7. The wiring board as claimed in claim 1, wherein the reinforcing metal layer is a dummy wiring having no electrical connections.

8. The wiring board as claimed in claim 1, wherein a distance between the pad and the reinforcing metal layer is greater than or equal to 10 μm.

9. The wiring board as claimed in claim 1, wherein a distance between the power supply pattern and the reinforcing metal layer is greater than or equal to 10 μm.

10. The wiring board as claimed in claim 1, wherein a length of a minor axis of an oval shape approximating a planar shape of the reinforcing metal layer is greater than or equal to 10 μm.

11. The wiring board as claimed in claim 1, wherein a thickness of the reinforcing metal layer and a thickness of the pad are identical.

12. The wiring board as claimed in claim 1, wherein a coefficient of thermal expansion of the second insulating layer is higher than a coefficient of thermal expansion coefficient of the first insulating layer.

13. The wiring board as claimed in claim 12, wherein a difference between a coefficient of thermal expansion of the second insulating layer and a coefficient of thermal expansion of the first insulating layer is greater than or equal to 10 ppm/° C.

14. A wiring board, comprising:
a first insulating layer;
a pad formed on one surface of the first insulating layer;
a second insulating layer, formed on the one surface of the first insulating layer, and including an opening exposing the pad; and
a reinforcing metal layer formed in contact with the first insulating layer, and provided around the pad so as to be separated from the pad in a plan view; wherein:
the pad is disposed inside the opening without making contact with the second insulating layer,
an end, on a side of the first insulating layer, in a portion of an inner side surface of the opening of the second insulating layer makes contact with the reinforcing metal layer,
an end, on the side of the first insulating layer, in another portion of the inner side surface of the opening of the second insulating layer makes contact with the one surface of the first insulating layer,
a first row, extending in a first direction, includes pads arranged at a constant pitch,
a second row, adjacent to the first row along a second direction perpendicular to the first direction, and extending in the first direction, includes pads arranged at the constant pitch, and
between the first and second rows, positions of the pads in the first row are shifted by one-half the constant pitch along the first direction with respect to positions of the pads in the second row.

* * * * *